(12) United States Patent
Sasagawa et al.

(10) Patent No.: US 9,105,749 B2
(45) Date of Patent: Aug. 11, 2015

(54) SEMICONDUCTOR DEVICE AND MANUFACTURING METHOD THEREOF

(75) Inventors: Shinya Sasagawa, Chigasaki (JP); Akihiro Ishizuka, Sagamihara (JP); Takehisa Hatano, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 437 days.

(21) Appl. No.: 13/466,583

(22) Filed: May 8, 2012

(65) Prior Publication Data

US 2012/0286261 A1 Nov. 15, 2012

(30) Foreign Application Priority Data

May 13, 2011 (JP) ................................. 2011-108052

(51) Int. Cl.
*H01L 29/12* (2006.01)
*H01L 21/8252* (2006.01)
*H01L 21/8256* (2006.01)
*H01L 27/06* (2006.01)
*H01L 27/12* (2006.01)
*H01L 29/786* (2006.01)
*H01L 21/336* (2006.01)

(52) U.S. Cl.
CPC ........ *H01L 21/8252* (2013.01); *H01L 21/8256* (2013.01); *H01L 27/0605* (2013.01); *H01L 27/1225* (2013.01); *H01L 29/7869* (2013.01); *H01L 29/78603* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 5,528,032 A | 6/1996 | Uchiyama | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,437,404 B1 * | 8/2002 | Xiang et al. | 257/347 |
| 6,563,174 B2 | 5/2003 | Kawasaki et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Robert Carpenter
(74) *Attorney, Agent, or Firm* — Eric J. Robinson; Robinson Intellectual Property Law Office, P.C.

(57) ABSTRACT

In a transistor including a wide band gap semiconductor layer as a semiconductor layer, a wide band gap semiconductor layer is separated into an island shape by an insulating layer with passivation properties for preventing atmospheric components from permeating. The edge portion of the island shape wide band gap semiconductor layer is in contact with the insulating film; thus, moisture or atmospheric components can be prevented from entering from the edge portion of the semiconductor layer to the wide band gap semiconductor layer.

16 Claims, 13 Drawing Sheets

(56) References Cited

U.S. PATENT DOCUMENTS

| | | | |
|---|---|---|---|
| 6,727,522 B1 | 4/2004 | Kawasaki et al. |
| 6,841,797 B2 | 1/2005 | Isobe et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,439,545 B2 | 10/2008 | Honda |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,777,414 B2 | 8/2010 | Honda |
| 7,821,002 B2 | 10/2010 | Yamazaki et al. |
| 8,034,674 B2 | 10/2011 | Nagai et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0159639 A1 | 6/2010 | Sakata |
| 2010/0167464 A1* | 7/2010 | Yamazaki .................... 438/104 |
| 2011/0024740 A1 | 2/2011 | Yamazaki et al. |
| 2011/0024750 A1 | 2/2011 | Yamazaki et al. |
| 2011/0024751 A1 | 2/2011 | Yamazaki et al. |
| 2011/0027980 A1 | 2/2011 | Yamazaki et al. |
| 2011/0031491 A1 | 2/2011 | Yamazaki et al. |
| 2011/0037068 A1 | 2/2011 | Yamazaki et al. |
| 2012/0175609 A1 | 7/2012 | Yamazaki |
| 2012/0267624 A1 | 10/2012 | Isobe et al. |

FOREIGN PATENT DOCUMENTS

| | | | |
|---|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-311764 | 11/2004 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for Amoled Back-Plane", SID Digest '09 : SID International Symposium Digest of Technical Papers, May 31, 2009, pp. 280-283.

Clark.S at al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

(56) References Cited

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T at al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H at al., "Temperature Dependence of Characteristics and Electronic Structure for Amorphous In—Ga—Zn—Oxide TFT", Am-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", Journal of SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.

Kikuchi.H et al., "62.2:Invited Paper:Fast Electro-Optical Switching In Polymer-Stabilized Liquid Crystalline Blue Phases For Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance Oxide thin film transistors passivated by various gas plasmas", 214th ECS Meeting, 2008, No. 2317, ECS.

Kimizuka.H. et al., "Spinel,YBFE2O4, and YB2FE3O7 Types of Structures for Compounds in the In2O3 and SC2O3—A2O3-BO Systems [A; Fe, Ga, Or Al; B: Mg, Mn, Fe, Ni, Cu,Or Zn]at Temperatures Over 1000 ° C.", Journal of Solid State Chemistry, 1985, vol. 60, pp. 382-384.

Kimizuka.H. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J at al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M at al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

(56) References Cited

OTHER PUBLICATIONS

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15,2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al. "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA Amoled Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

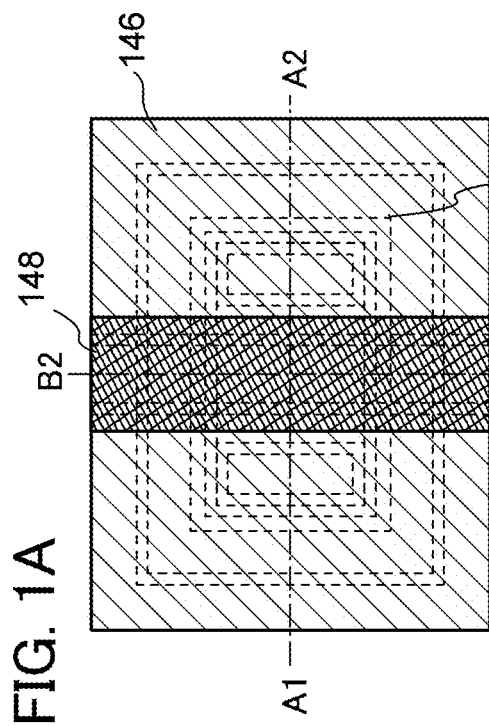
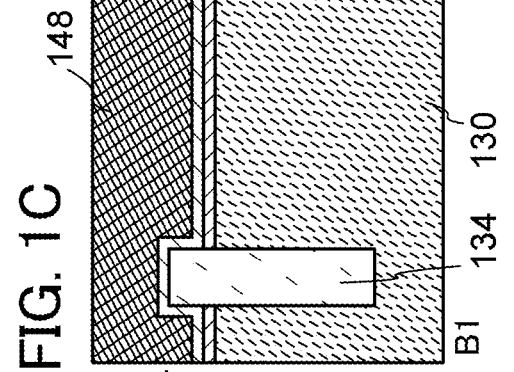
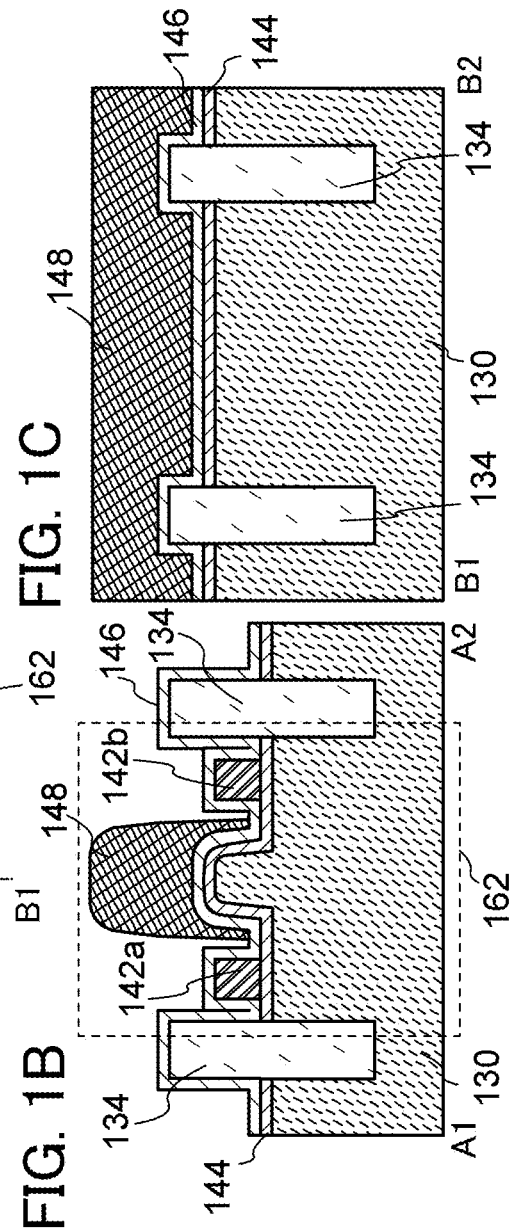

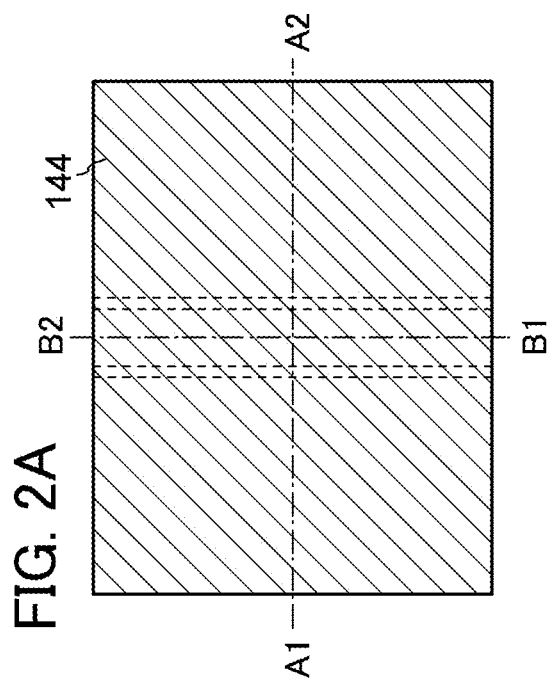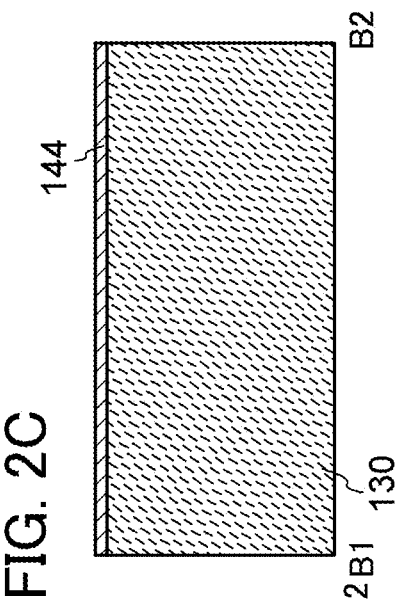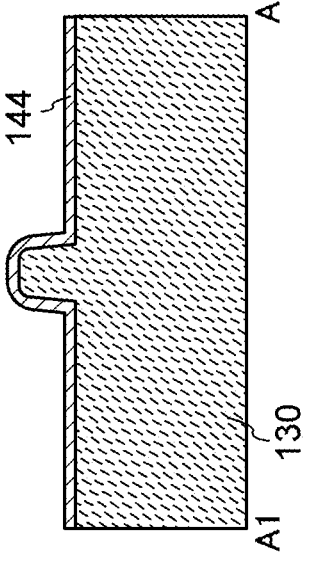

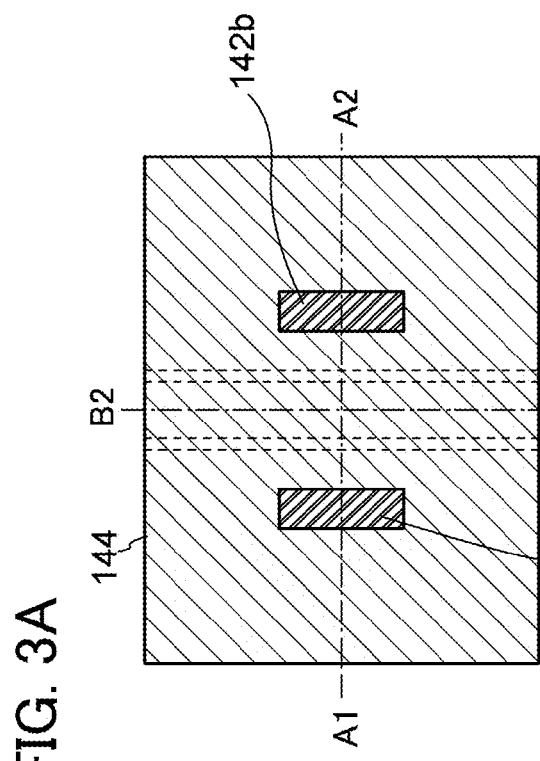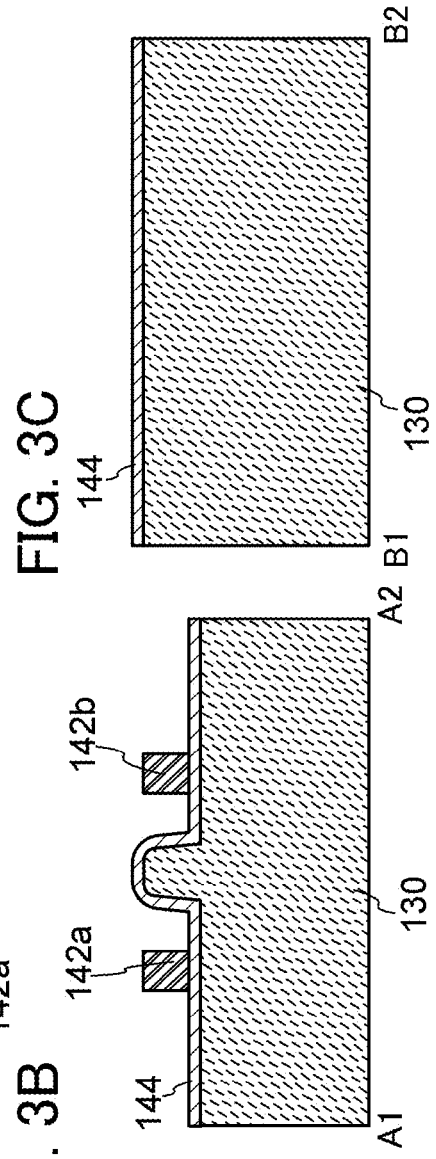

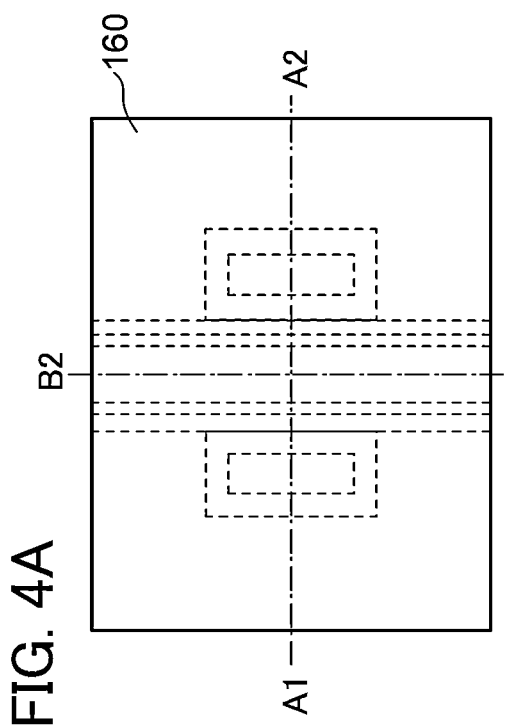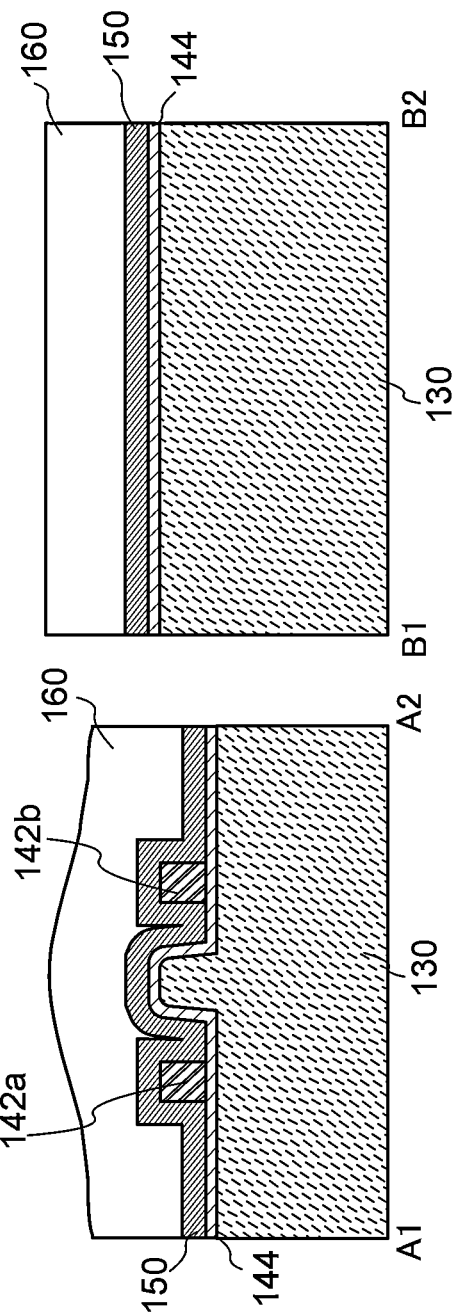

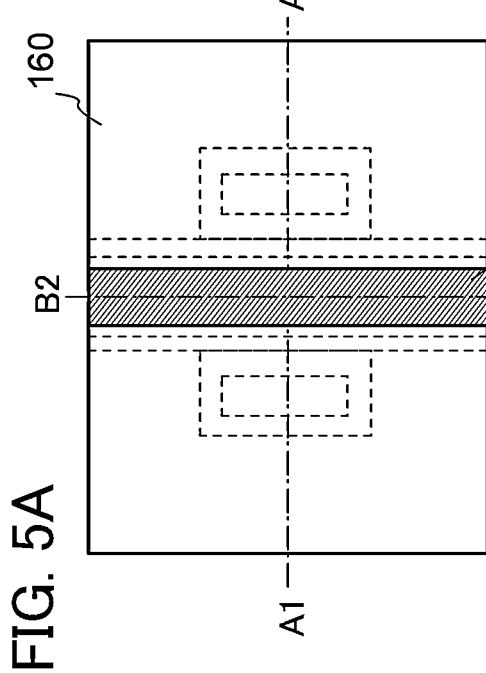
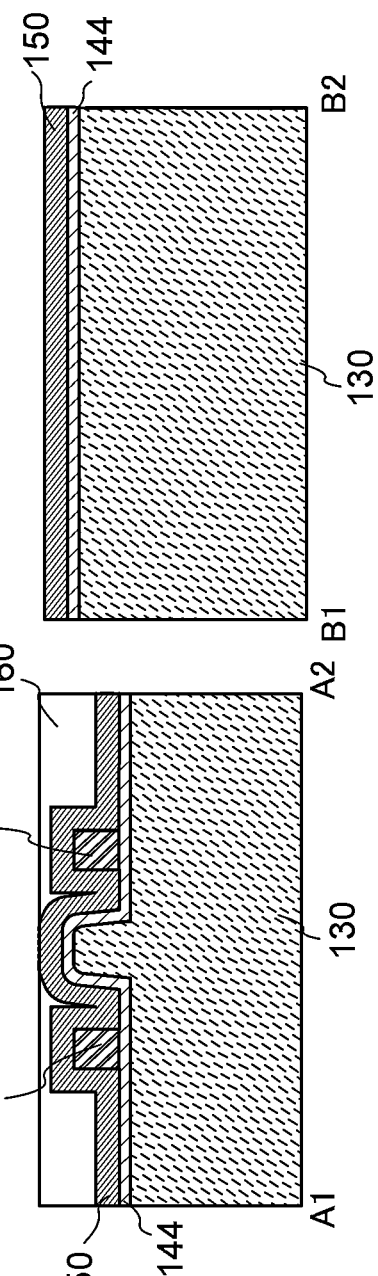

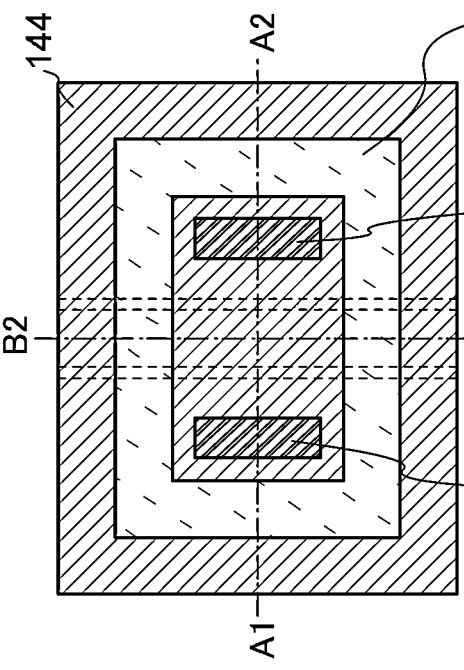
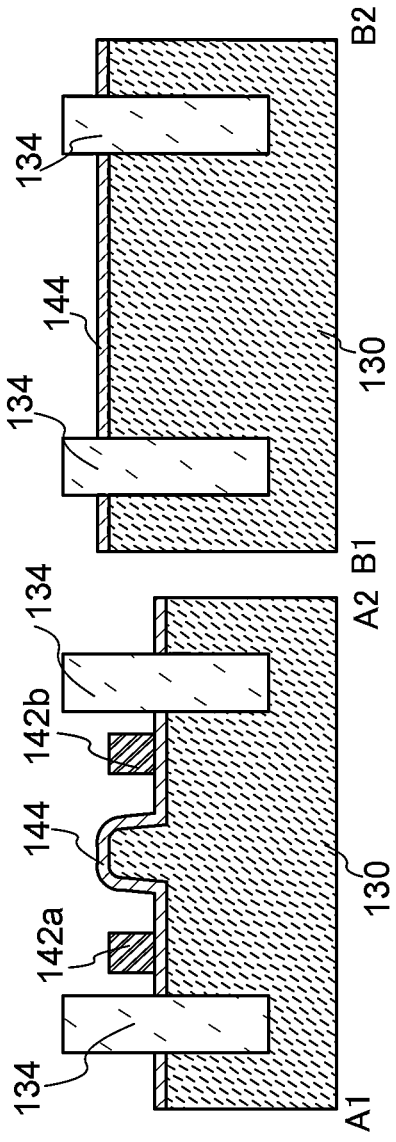

c-axis direction electric charge 0 electric charge +1 electric charge 0 ab-plane electric charge −1 electric charge 0

● In
○ Ga
○ Zn
● O

- In
- Ga or Zn
- O

- In
- Ga
- Zn
- O

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

2. Description of the Related Art

It is considered that a semiconductor device with low power consumption is more and more important for long battery life or for eco-friendly goods. In order to manufacture such a semiconductor device with low power consumption, a semiconductor device has been miniaturized. However, as a demerit of miniaturization of a semiconductor device, degradation of electrical characteristics of a semiconductor device, especially an increase in leakage current, is obvious (Patent Document 1).

In order to reduce a leakage current, in a semiconductor device including silicon as a semiconductor layer, specifically, a field-effect transistor, a junction depth of a source region and a drain region that are adjacent to a channel region of the transistor is made to be shallow. However, the method is not sufficient for reducing a leakage current.

REFERENCE

Patent Document

[Patent Document 1] Japanese Published Patent Application No. 2004-311764

SUMMARY OF THE INVENTION

A transistor that includes, instead of an active silicon layer, a semiconductor that has wide band gap and low carrier density as an active layer has been proposed in order to solve the problem of a leakage current of the above-described field-effect transistor including silicon.

However, in some cases, the electric characteristics of the transistor that includes a semiconductor having wide band gap and low carrier density as an active layer are decreased due to moisture or atmospheric components entering the semiconductor layer from the outside. Specifically, in some cases, the threshold value of the transistor is shifted, whereby the leakage current thereof is increased.

Accordingly, one object of one embodiment of the present invention is to provide a semiconductor device that includes a transistor including, instead of an active silicon layer, a semiconductor that has wide band gap and low carrier density as an active layer and in which a decrease or a variation in electric characteristics is not easily caused. In addition, one object of one embodiment of the invention is to provide a manufacturing method of the semiconductor device.

In order to achieve the above-described object, the present inventors have reached a semiconductor device into which moisture or atmospheric components are prevented from entering from the edge portion of a semiconductor layer formed into an island shape and a manufacturing method of the semiconductor device, and the above-described object is solved.

That is, a semiconductor device of one embodiment of the present invention includes a first insulating layer whose surface is provided with a projection, a wide band gap semiconductor layer provided in contact with the first insulating layer, a second insulating layer that separates the wide band gap semiconductor layer into an island shape, a gate insulating layer provided in contact with the wide band gap semiconductor layer, a gate electrode provided in contact with the gate insulating layer and covering the projection of the first insulating layer, and a pair of a source electrode and a drain electrode in contact with the wide band gap semiconductor layer with the projection of the first insulating layer interposed therebetween, in which the distance between a flat surface of the first insulating layer and a top surface of the wide band gap semiconductor layer is larger than the distance between the flat surface of the first insulating layer and a top surface of the projection of the first insulating layer and smaller than the distance between the flat surface of the first insulating layer and a top surface of the second insulating layer.

When the above-described structure is employed for a transistor including a wide band gap semiconductor layer, the wide band gap semiconductor layer can be separated into an island shape by a second insulating layer. Therefore, for example, leakage current flowing between adjacent transistors can be reduced.

A semiconductor device of one embodiment of the present invention preferably has a second insulating layer with passivation properties.

In a semiconductor device with the above-described structure, an edge portion of the wide band gap semiconductor layer is in contact with an insulating film. As a result, external moisture or atmospheric components are not likely to enter from the edge portion to the inside of the wide band gap semiconductor layer. When such a wide band gap semiconductor layer is used for a channel region of a semiconductor device, a decrease or a variation in electric characteristics of the transistor is not easily caused. Note that a channel region is a region in which a channel is formed.

Further, a semiconductor device of one embodiment of the present invention preferably includes a second insulating layer with passivation properties containing any one of aluminum oxide, aluminum oxynitride, aluminum nitride, silicon nitride, gallium oxide, and gallium nitride.

The edge portion of the wide band gap semiconductor layer is in contact with the second insulating layer with passivation properties. Thus, external moisture or atmospheric components can be prevented from entering from the edge portion of the wide band gap semiconductor layer. As a result, a semiconductor device in which a decrease or a variation in electric characteristics is not easily caused can be obtained.

A manufacturing method of a semiconductor device of one embodiment of the present invention includes the following steps: a step for forming a first insulating layer over a substrate, a step for forming a projection in the first insulating layer, a step for forming a wide band gap semiconductor layer covering the projection of the first insulating layer, a step for forming a source electrode or a drain electrode which are in contact with the wide band gap semiconductor layer, a step for forming a stopper film covering the wide band gap semiconductor layer, a step for covering the first insulating layer with an insulating film that is easily embedded, a step for planarizing the insulating film that is easily embedded up to a highest portion of the stopper film by a CMP method, a step for forming a trench in a region in which the second insulating layer is to be formed, a step for filling the trench with the second insulating layer, a step for planarizing the second insulating layer up to a highest portion of the stopper film by a CMP method, a step for removing the insulating film that is easily embedded by etching, a step for removing the stopper film by etching, a step for forming a gate insulating layer, and a step for forming a gate electrode.

With the manufacturing method, a semiconductor device in which the second insulating layer is in contact with an edge portion of the wide band gap semiconductor layer can be manufactured. Further, even in the case where the second insulating layer is formed using a material that is not easily patterned by dry etching, a semiconductor device in which the second insulating layer is in contact with the edge portion of the wide band gap semiconductor layer can be manufactured.

The above-described manufacturing method is a method in which the second insulating layer is embedded into the trench after steps of formation of the stopper film and planarization of the insulating film that is easily embedded. With the manufacturing method, a material having low etching selection ratio with respect to the wide band gap semiconductor layer can be used for the second insulating layer. Further, the wide band gap semiconductor layer can be separated into an island shape by the second insulating layer.

Further, in a manufacturing method of a semiconductor device of one embodiment of the present invention, a wide band gap semiconductor layer is an oxide semiconductor, and a stopper film contains one of silicon and silicon nitride.

Silicon and silicon nitride have a high etching selection ratio with respect to an oxide semiconductor. Thus, when a material of one of silicon and silicon nitride is used for a stopper film and a step for removing the stopper film by etching is performed, a surface of an oxide semiconductor that is an active layer is not seriously damaged. Accordingly, a semiconductor device in which a decrease or a variation in electric characteristics is not easily caused can be manufactured.

According to the present invention, a semiconductor device in which a decrease or a variation in electric characteristics is not easily caused can be manufactured. Further, a manufacturing method of a semiconductor device including a wide band gap semiconductor layer can be provided.

BRIEF DESCRIPTION OF THE DRAWINGS

FIGS. 1A to 1C are a top view and cross-sectional views illustrating a structure of a semiconductor device of one embodiment of the present invention.

FIGS. 2A to 2C are a top view and cross-sectional views illustrating a manufacturing process of a semiconductor device of one embodiment of the present invention.

FIGS. 3A to 3C are a top view and cross-sectional views illustrating a manufacturing process of a semiconductor device of one embodiment of the present invention.

FIGS. 4A to 4C are a top view and cross-sectional views illustrating a manufacturing process of a semiconductor device of one embodiment of the present invention.

FIGS. 5A to 5C are a top view and cross-sectional views illustrating a manufacturing process of a semiconductor device of one embodiment of the present invention.

FIGS. 8A to 8C are a top view and cross-sectional views illustrating a manufacturing process of a semiconductor device of one embodiment of the present invention.

DETAILED DESCRIPTION OF THE INVENTION

Figure 6A:
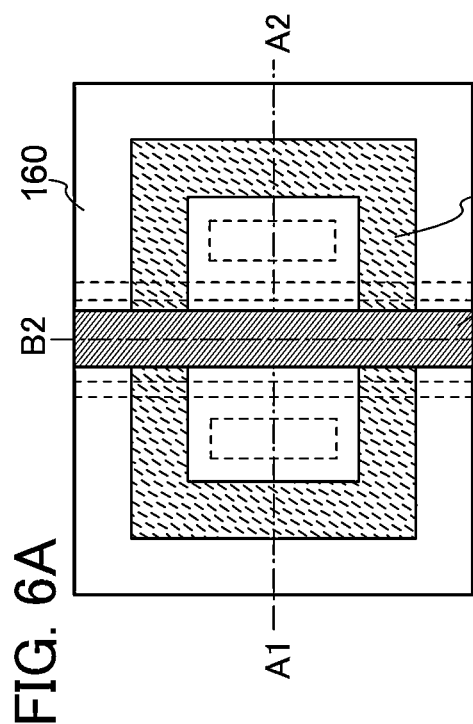
FIGS. 6A to 6C are a top view and cross-sectional views illustrating a manufacturing process of a semiconductor device of one embodiment of the present invention.

Hereinafter, embodiments of the present invention are described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Embodiment 1

In this embodiment, a structure of a semiconductor device of one embodiment of the present invention is described with reference to FIGS. 1A to 1C. FIG. 1A illustrates an example of a top view of a transistor 162 of this embodiment, and FIGS. 1B and 1C illustrate a cross sectional view taken along dotted-dashed line A1-A2 and a cross sectional view taken along dotted-dashed line B1-B2 in FIG. 1A, respectively.

The transistor 162 described in this embodiment includes a first insulating layer 130, a wide band gap semiconductor layer 144 provided in contact with the first insulating layer 130, a source electrode (or drain electrode) 142a provided in contact with the wide band gap semiconductor layer 144, a drain electrode (or source electrode) 142b provided in contact with the wide band gap semiconductor layer 144, a second insulating layer 134 that separates the wide band gap semiconductor layer 144 into an island shape, a gate insulating layer 146 provided over the wide band gap semiconductor layer 144, a gate electrode 148 and an interlayer insulating film 180 that are provided over the gate insulating layer 146, and a wiring 170.

(First Insulating Layer)

The first insulating layer 130 includes a projection. The first insulating layer 130 can be formed using a silicon oxide film, a gallium oxide film, an aluminum oxide film, a silicon nitride film, a silicon oxynitride film, an aluminum oxynitride film, or a silicon nitride oxide film. A surface that is adjacent to the projection of the first insulating layer 130 is referred to as a flat surface.

(Wide Band Gap Semiconductor Layer)

The wide band gap semiconductor layer 144 can be formed to have a thickness of greater than or equal to 1 nm and less than or equal to 100 nm. Further, a semiconductor that has band gap wider than that of silicon, 1.1 eV, can be used for the wide band gap semiconductor layer 144. As an example of such an oxide semiconductor, gallium nitride, gallium oxynitride, gallium zinc oxynitride, or the like can be given; for example, an In—Ga—Zn-based oxide semiconductor having a band gap of 3.15 eV, indium oxide having a band gap of about 3.0 eV, indium tin oxide having a band gap of about 3.0 eV, indium gallium oxide having a band gap of about 3.3 eV, indium zinc oxide having a band gap of about 2.7 eV, tin oxide having a band gap of about 3.3 eV, zinc oxide having a band gap of about 3.37 eV, or the like can be preferably used.

(Source Electrode and Drain Electrode)

The source electrode 142a and the drain electrode 142b can be formed using a metal material such as molybdenum, titanium, tantalum, tungsten, aluminum, copper, chromium, neodymium, or scandium, or an alloy material that includes any of these materials as its main component.

(Second Insulating Layer)

The second insulating layer 134 is an insulating layer with passivation properties for blocking moisture or hydrogen. The second insulating layer 134 is used for preventing external moisture or atmospheric components from entering from the edge portion to the inside of the wide band gap semiconductor layer 144. This is because if the entry of external moisture or atmospheric components to the inside of the wide band gap semiconductor layer 144 can be prevented, a transistor in which a decrease or a variation in electric characteristics is not easily caused can be formed. For the second insulating layer 134 with passivation properties, aluminum oxide, aluminum nitride oxide, aluminum nitride, silicon nitride, gallium oxide, gallium nitride, or the like can be used.

(Gate Insulating Layer)

As a material for the gate insulating layer 146, an insulating film can be used. For example, an insulating film formed using silicon oxide, hafnium oxide, yttrium oxide, hafnium silicate, hafnium aluminate, hafnium silicate to which nitrogen is added, hafnium aluminate to which nitrogen is added, lanthanum oxide, or the like can be used.

(Gate Electrode)

As the gate electrode 148, a material having electric conductivity and adhesion to the gate insulating layer 146 can be used. For example, a metal material such as molybdenum, titanium, tantalum, copper, tungsten, aluminum, chromium, neodymium, or scandium or an alloy material containing any of these materials as a main component can be used. The gate electrode 148 may have a single-layer structure or a stacked structure.

(Interlayer Insulating Film)

As a material for the interlayer insulating film 180, an insulating film can be used. For example, an insulating film formed using silicon oxide, silicon nitride, aluminum oxide, or the like can be used.

(Wiring)

As the wiring 170, a material having electric conductivity and adhesion to a drain electrode (or source electrode) can be used. For example, a metal material such as molybdenum, titanium, tantalum, copper, tungsten, aluminum, chromium, neodymium, or scandium or an alloy material containing any of these materials as a main component can be used. Note that the wiring 170 may have a single-layer structure or a stacked structure.

The transistor 162 illustrated in FIGS. 1A to 1C includes the wide band gap semiconductor layer 144 to be in contact with the first insulating layer 130. A cross-sectional shape of the wide band gap semiconductor layer 144 in the channel length direction (direction of carrier flow) is a projecting shape due to the shape of the projection of the first insulating layer 130. Therefore, as the projection of the first insulating layer 130 is higher, an effective channel length of the transistor 162 is lengthened.

Thus, even when the distance between the source electrode 142a and the drain electrode 142b is short, an effective channel length can be maintained by setting the height of the projection of the first insulating layer 130 as appropriate. Accordingly, a short-channel effect can be suppressed while miniaturization of the transistor is achieved. The second insulating layer 134 is formed to surround the island shape wide band gap semiconductor layer 144.

<Manufacturing Method of Semiconductor Device>

An example of a manufacturing process of the transistor 162 illustrated in FIGS. 1A to 1C is described below with reference to FIGS. 2A to 2C, FIGS. 3A to 3C, FIGS. 4A to 4C, FIGS. 5A to 5C, FIGS. 6A to 6C, FIGS. 7A to 7C, and FIGS. 8A to 8C. Note that in each of these drawings, A is a top view of the transistor 162 in the manufacturing process thereof and B is a cross-sectional view taken along the chain line A1-A2 in the top view A. Similarly, C is a cross-sectional view taken along the chain line B1-B2 in the top view A.

FIGS. 2A to 2C illustrate a semiconductor device on which steps from formation of the first insulating layer 130 including a projection up to formation of the wide band gap semiconductor layer 144 are performed.

(Formation of Projection of First Insulating Layer)

First, the first insulating layer 130 is formed over a substrate (not illustrated), and then a projection is formed. The projection may be formed using a known technique; for example, the projection can be formed in a single etching step or through a plurality of etching steps.

Note that it is necessary that the substrate over which the first insulating layer 130 is formed to have heat resistance high enough to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate of silicon, silicon carbide, or the like, a compound semiconductor substrate of silicon germanium or the like, an SOI (silicon on insulator) substrate, or the like can be used.

(Formation of Wide Band Gap Semiconductor Layer)

Next, the wide band gap semiconductor layer 144 is formed to be in contact with the first insulating layer 130 (see FIGS. 2A to 2C). The wide band gap semiconductor layer 144 is provided to cover the projection of the first insulating layer 130.

(Formation of Source Electrode and Drain Electrode)

FIGS. 3A to 3C illustrate a semiconductor device on which steps up to formation of the source electrode 142a and the drain electrode 142b are performed. The source electrode 142a and the drain electrode 142b are formed to be in contact with the wide band gap semiconductor layer 144 with the projection of the first insulating layer 130 interposed therebetween (see FIGS. 3A to 3C). This is because a channel of the transistor is formed in a projecting portion of the wide band gap semiconductor layer 144.

FIGS. 4A to 4C illustrate a semiconductor device on which steps from formation of a stopper film 150 up to formation of an insulating film 160 are performed.

(Formation of Stopper Film)

The stopper film 150 for protecting the wide band gap semiconductor layer 144 is formed to be in contact with the wide band gap semiconductor layer 144. The stopper film 150 has a function for preventing the wide band gap semiconductor layer 144 from being damaged by a chemical mechanical polishing (CMP) method. The stopper film 150 is removed by etching in a later process and thus preferably has a high etching selection ratio with respect to the wide band gap semiconductor layer 144.

(Formation of Insulating Film)

Next, the insulating film 160 is formed to be in contact with the stopper film 150 (see FIGS. 4A to 4C). The insulating film 160 is formed in order to reduce unevenness caused by the projection of the first insulating layer 130 and the source electrode 142a and the drain electrode 142b. When an insulating film with excellent coverage is used, unevenness can be reduced.

The insulating film 160 can be formed using a silicon oxide based insulating film. The silicon oxide based insulating film can be formed by a low-pressure chemical vapor deposition (CVD) method using an organic silane-based gas and an oxidizing gas as a source gas. As the organic silane-based gas, tetraethoxysilane (TEOS), tetramethyl orthosilicate (TMOS), diacetoxy ditertialybutoxy silane (DADBS), or the like can be used. The silicon oxide based insulating film can be formed by an atmospheric pressure CVD method, an added pressure CVD method, a plasma CVD method, or an emission excitation CVD method, as well as the low-pressure CVD method. Further, the silicon oxide based insulating film may be formed, as well as by a CVD method, using a spin on glass (SOG) film that can be obtained by a spin coating method using alkoxysilane.

(Planarization of Insulating Film)

FIGS. 5A to 5C illustrate a semiconductor device on which steps up to planarization of an insulating film 160 is performed. The insulating film 160 is planarized by a CMP method to expose the highest portion of the stopper film 150 (see FIGS. 5A to 5C). At this stage, the surface of the insulating film is planarized, so that a later photolithography step and a later etching step can be performed easier.

(Formation of Trench)

Figure 6C:
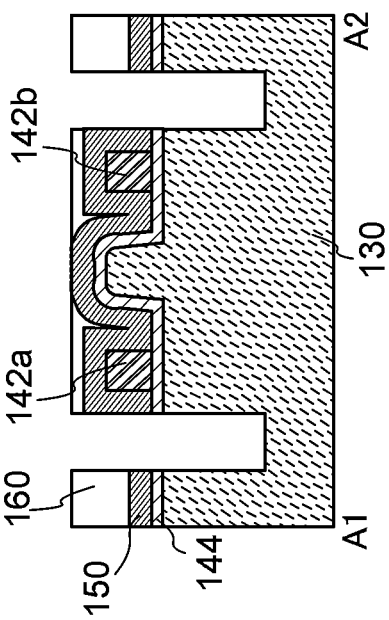
Figure 6B:
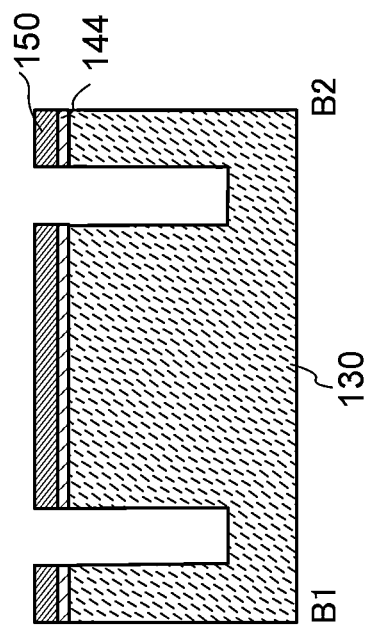

FIGS. 6A to 6C illustrate a semiconductor device on which steps up to formation of a trench is performed. A trench is formed in a region in which the second insulating layer 134 is to be formed by a photolithography step and an etching step (FIGS. 6A to 6C). The trench may have a depth in which the wide band gap semiconductor layer 144 can be separated into an island shape.

Figure 7A:
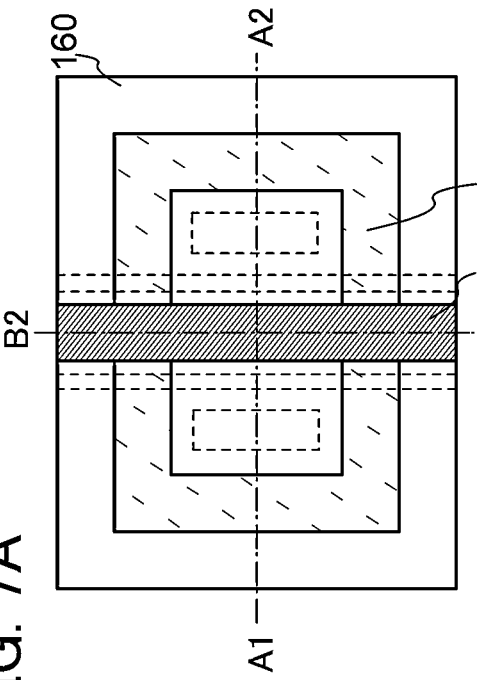
FIGS. 7A to 7C are a top view and cross-sectional views illustrating a manufacturing process of a semiconductor device of one embodiment of the present invention.
Figure 7C:
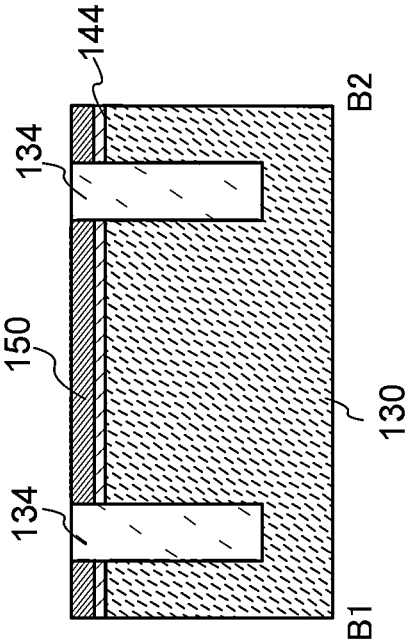
Figure 7B:
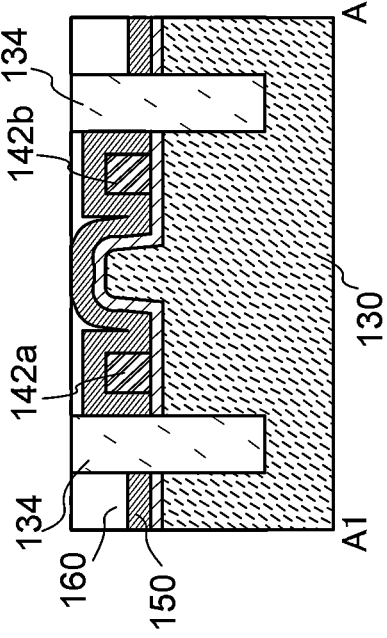

FIGS. 7A to 7C illustrate a semiconductor device on which steps from filling the trench with the second insulating layer 134 up to planarization of the surface of the semiconductor device are performed.

(Filling Trench)

The second insulating layer 134 is formed to fill the trench. The second insulating layer 134 is preferably an insulating film with passivation properties for blocking moisture or hydrogen. For example, the second insulating layer 134 can be formed using aluminum oxide or the like by a sputtering method.

(Planarization of Second Insulating Layer)

Next, the second insulating layer 134 is planarized up to the highest portion of the stopper film 150 by a CMP method (see FIGS. 7A to 7C). With this step, the wide band gap semiconductor layer 144 can be separated into an island shape by the second insulating layer 134. Further, with this step, an edge portion of the wide band gap semiconductor layer 144 can be in contact with the second insulating layer 134. Further, with this step, the second insulating layer 134 can be formed without performing a photolithography step and an etching step. In particular, it is difficult to perform patterning on a material that is not easily dry etched (e.g., aluminum oxide) by a photolithography step and a dry etching step. However, when the manufacturing method is used, an insulating film that is not easily dry etched can be patterned. Further, with the insulating film, the wide band gap semiconductor layer 144 can be separated into an island shape by the insulating layer.

FIGS. 8A to 8C illustrate a semiconductor device on which steps from etching of the insulating film 160 up to etching of the stopper film 150 are performed.

(Etching of Insulating Film)

The insulating film 160 is removed by etching. As the etching, either dry etching or wet etching may be used.

(Etching of Stopper Film)

Next, the stopper film 150 is removed by etching (see FIGS. 8A to 8C). The stopper film 150 preferably has a high etching selection ratio with respect to the wide band gap semiconductor layer 144. Although either dry etching or wet etching may be used as the etching, dry etching is preferably used. This is because the stopper film 150 can be selectively etched without severe damage to the surface of the wide band gap semiconductor layer 144.

(Formation of Gate Insulating Layer)

Next, the gate insulating layer 146 is formed over the exposed wide band gap semiconductor layer 144. The gate insulating layer 146 can have a thickness of greater than or equal to 1 nm and less than or equal to 100 nm and can be formed by a sputtering method, a molecular beam epitaxy (MBE) method, a chemical vapor deposition (CVD) method, a pulsed laser deposition method, an atomic layer deposition (ALD) method, a spin coating method, a printing method, or the like as appropriate. Note that steps for forming the gate insulating layer and the gate electrode are not illustrated.

(Formation of Gate Electrode)

Next, the gate electrode 148 is formed to cover the projection of the first insulating layer 130. The gate electrode 148 may be formed to cover the projecting portion of the wide band gap semiconductor layer 144 in which a channel is formed.

Through the above-described process, the transistor 162 illustrated in FIGS. 1A to 1C can be manufactured.

As described above, in the transistor 162 described in this embodiment, the wide band gap semiconductor layer 144 in which a channel is formed is separated into an island shape by the second insulating layer 134, and the edge portion of the island shape wide band gap semiconductor layer 144 is in contact with the second insulating layer 134. Entry of external atmospheric components, specifically moisture or hydrogen, from the edge portion of the wide band gap semiconductor layer 144 can be prevented because the second insulating layer 134 has passivation properties. As a result, the transistor 162 in which a decrease or a variation in electric characteristics is not easily caused can be manufactured.

An insulating film that is not easily patterned by dry etching can be patterned with employment of the manufacturing method of the transistor 162. Further, the transistor 162 can be isolated from other transistors by the insulating film. Thus, leakage current flowing between adjacent transistors can be reduced.

Figure 12:
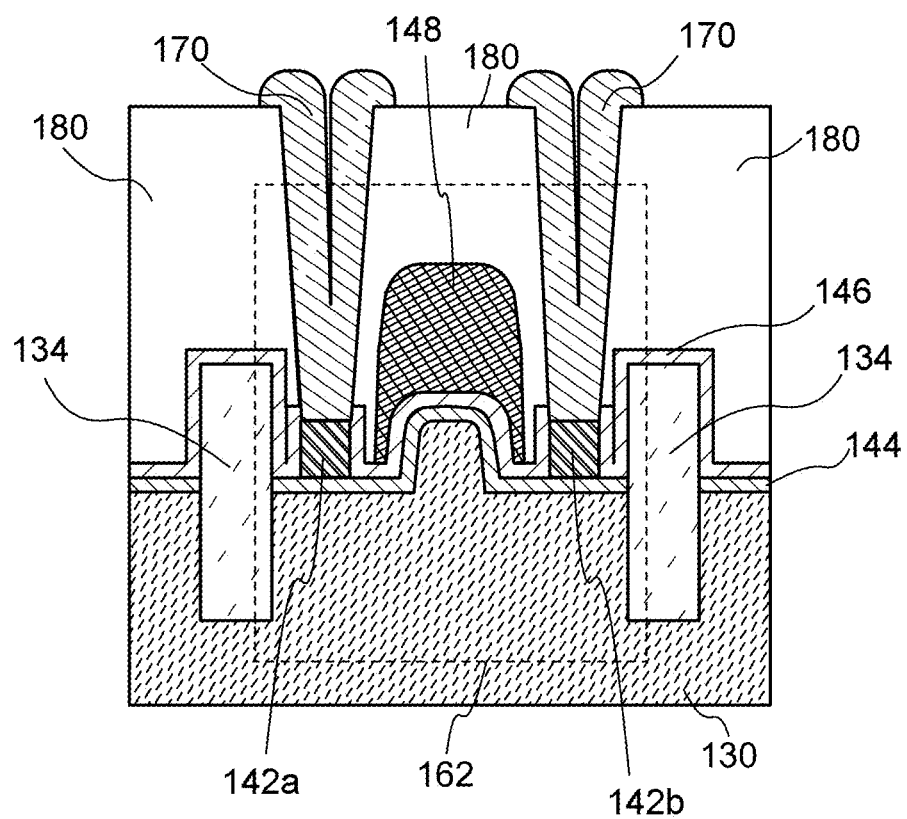
FIG. 12 is a cross-sectional view illustrating a structure of a semiconductor device of one embodiment of the present invention.

Note that the transistor 162 described in this embodiment can be used as a semiconductor device when the source electrode 142a and the drain electrode 142b are connected to the wirings 170 (FIG. 12).

Embodiment 2

In this embodiment, a structure and a manufacturing method in the case where the wide band gap semiconductor layer 144 described in Embodiment 1 as an example includes an oxide semiconductor are described.

In this embodiment, the structures of the wide band gap semiconductor layer 144, the first insulating layer 130, the gate insulating layer 146, the gate electrode 148, and the stopper film 150 are different from those in Embodiment 1. Hereinafter, the structures are explained. Description in Embodiment 1 can be referred to for the other structures.
<Structure Example of Semiconductor Device Including Oxide Semiconductor>

In this embodiment, an example in which an oxide semiconductor is used for the wide band gap semiconductor layer 144 described in Embodiment 1 is described. Hereinafter, the layer is referred to as an oxide semiconductor layer.
(Oxide Semiconductor)

The oxide semiconductor layer is a thin film deposited to have a thickness of greater than or equal to 1 nm and less than or equal to 100 nm.

A material that can be used as an oxide semiconductor preferably contains at least indium (In) or zinc (Zn). In particular, In and Zn are preferably contained. As a stabilizer for reducing variations in electrical characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main component and there is no particular limitation on the ratio of In:Ga:Zn. Further, a metal element in addition to In, Ga, and Zn may be contained.

As the oxide semiconductor, a material expressed as the chemical formula $InMO_3(ZnO)_m$ (m>0, m is not an integer) may be used. Note that M denotes one metal element or a plurality of metal elements selected from Ga, Fe, Mn, and Co. Alternatively, as the oxide semiconductor, a material expressed by a chemical formula, $In_3SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials, a material with an appropriate composition may be used depending on needed semiconductor characteristics (e.g., mobility, threshold voltage, and a variation).

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$. For example, r may be 0.05. The same applies to other oxides.
(First Insulating Layer)

In order to prevent a carrier from being generated in the oxide semiconductor due to the oxygen vacancies, an oxide insulating film from which part of the oxygen is released by heating is used for the first insulating layer 130 that is in contact with the oxide semiconductor layer. As such an oxide insulating film, an oxide insulating film which contains an oxygen whose amount exceeds an amount of oxygen satisfying the stoichiometric proportion is preferably used; when silicon oxide is used for the oxide insulating film, for example, $SiO_{2+\alpha}$ ($\alpha>0$) can be given as an example.

The first insulating layer 130 from which part of the oxygen is released by heating is provided to be in contact with the oxide semiconductor layer, whereby supplies oxygen to the oxide semiconductor layer 144a to repair oxygen vacancies generated in the oxide semiconductor layer 144a, and an i-type (intrinsic) or substantially i-type oxide semiconductor is formed. As a result, a decrease or a variation in electric characteristics of the transistor can be suppressed.
(Gate Insulating Layer)

As in the first insulating layer 130, in order to prevent a carrier from being generated in the oxide semiconductor layer 144a due to oxygen vacancies, an oxide insulating film which contains oxygen and from which part of the oxygen is released by heating is used as the gate insulating layer 146 that is in contact with the oxide semiconductor layer 144a. As such an oxide insulating film, an oxide insulating film which contains an oxygen whose amount exceeds an amount of oxygen satisfying the stoichiometric proportion is used. In the case of using silicon oxide, for example, the silicon oxide is $SiO_{2+\alpha}$ ($\alpha>0$). As in the first insulating layer 130, oxygen can be supplied to the oxide semiconductor layer 144a. A structure using such an insulating film can make electric characteristics of the transistor excellent.

An insulating film from which impurities such as hydrogen are sufficiently removed is preferably used as the gate insulating layer 146, so that a decrease or a variation in electric characteristics of the transistor due to diffusion of impurities such as hydrogen in the gate insulating layer 146 into the oxide semiconductor layer can be suppressed.
(Second Insulating Layer)

Next, the second insulating layer 134 is described. The second insulating layer 134 is preferably an insulating layer with passivation properties for blocking moisture or hydrogen. The second insulating layer 134 is provided to be in contact with the edge portion of the oxide semiconductor layer, so that entry of external moisture or atmospheric components from the edge portion to the inside of the oxide semiconductor layer can be prevented. Electric reliability of the transistor including the oxide semiconductor can be increased when entry of external moisture or atmospheric components to the inside of the oxide semiconductor layer is prevented. For the second insulating layer with passivation properties, aluminum oxide, aluminum nitride oxide, aluminum nitride, silicon nitride, gallium oxide, gallium nitride, or the like can be used.

(Gate Electrode)

Next, the gate electrode 148 is described. In the case where the gate electrode 148 has a single layer structure, description in Embodiment 1 can be referred to for the material of the gate electrode 148.

Note that in order to make the threshold voltage of the semiconductor device control to be the positive side and make the semiconductor device be a so-called normally-off switching element, the gate electrode needs to have an appropriate work function on a side in contact with the gate insulating layer 146. When such threshold voltage control is performed on the semiconductor device including an oxide semiconductor in an active layer, the work function of the gate electrode 148 needs to be 5 eV or higher, preferably 5.5 eV or higher. For such a conductive film having a high work function, a metal oxide containing nitrogen is preferably used.

Specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film is preferably used.

In the case where the gate electrode 148 has a stacked structure, one of layers of the gate electrode 148 that is in contact with the gate insulating layer 146 is preferably formed using a material having a high work function. In particular, as the one of the layers of the gate electrode 148 that is in contact with the gate insulating layer 146, for example, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film is preferably used. These films have a work function of 5 eV or higher, preferably 5.5 eV or higher, and the use of any of these films as the gate electrode makes the threshold voltage of the transistor positive. Accordingly, a so-called normally-off switching element can be obtained.

<Manufacturing Method of Semiconductor Device Including Oxide Semiconductor Layer>

A manufacturing method of a semiconductor device of one embodiment of the present invention is described. Specifically, a manufacturing method of a semiconductor device including an oxide semiconductor layer with reduced carrier density by reducing oxygen vacancies or entry of impurities is described.

(Formation of Projection of First Insulating Layer)

First, after the first insulating layer 130 is formed over a substrate, a projection is formed. The first insulating layer 130 is a film which contains oxygen and from which part of the oxygen is released by heating, i.e., a film that can be used for treatment for repairing oxygen vacancies (treatment for supplying oxygen) in the oxide semiconductor layer 144a, which is described later.

The first insulating layer 130 has a thickness in the range of greater than or equal to 100 nm and less than or equal to 500 nm and can be formed by a sputtering method, a molecular beam epitaxy (MBE) method, a chemical vapor deposition (CVD) method, a pulsed laser deposition method, an atomic layer deposition (ALD) method, a coating method, a printing method, or the like as appropriate. Specifically, a silicon oxide film of $SiO_{2+\alpha}$ ($\alpha>0$), which contains excess oxygen, is used. The projection may be formed using a known technique; for example, the projection can be formed in a single etching step or through a plurality of etching steps.

(Formation Method of Oxide Semiconductor Layer)

Although a variety of oxide semiconductor materials can be used for the oxide semiconductor layer of the present invention, an oxide semiconductor with low carrier density is preferably used in order to manufacture a transistor in which a decrease or a variation in electric characteristics is not easily caused. A formation method of the oxide semiconductor layer with low carrier density has two steps that are high purification and treatment for supplying oxygen. As the first step, impurities, which cause generation of carriers, such as hydrogen or moisture in an oxide semiconductor layer are reduced. As the second step, oxygen is supplied to the oxide semiconductor layer in order to reduce oxygen vacancies that cause generation of carriers (treatment for supplying oxygen). Through the step, oxygen vacancies in the oxide semiconductor layer are reduced and carrier density is reduced. High purification and treatment for supplying oxygen are described later.

(Thickness and Formation Method of Oxide Semiconductor Layer)

The thickness of the oxide semiconductor layer is set to greater than or equal to 1 nm and less than or equal to 100 nm. The oxide semiconductor layer can be formed by a sputtering method, a molecular beam epitaxy (MBE) method, a pulsed laser deposition method, an atomic layer deposition (ALD) method, or the like as appropriate. The oxide semiconductor layer may be formed using a sputtering system that performs deposition with surfaces of a plurality of substrates set substantially perpendicular to a surface of a sputtering target, which is a so-called columnar plasma (CP) sputtering system. The thickness and the formation apparatus of the oxide semiconductor layer which are appropriate for a semiconductor device to be manufactured may be selected.

(Atmosphere in Formation of Oxide Semiconductor Layer)

The oxide semiconductor layer may be formed in a rare gas (typically argon) atmosphere, an oxygen atmosphere, a mixed atmosphere containing a rare gas and oxygen, or the like. In particular, it is preferable to form the oxide semiconductor layer in an atmosphere using a high-purity gas from which impurities such as hydrogen, water, a hydroxyl group, and hydride are sufficiently removed so that entry of hydrogen, water, a hydroxyl group, hydride, and the like into the oxide semiconductor layer can be prevented. For example, the purity of the argon is preferably higher than or equal to 8N (99.999999%), more preferably higher than or equal to 9N (99.9999999%) (that is, the concentration of $H_2O$ is preferably lower than or equal to 1 ppb, more preferably lower than or equal to 0.1 ppb, the concentration of $H_2$ is preferably 5 ppb, more preferably lower than or equal to 0.5 ppb, and the dew point is preferably −121° C.). The purity of the oxygen is preferably higher than or equal to 7N (99.99999%), more preferably higher than or equal to 8N (99.999999%) (that is, the concentration of $H_2O$ is preferably lower than or equal to 10 ppb, more preferably lower than or equal to 1 ppb, the concentration of $H_2$ is preferably 10 ppb, more preferably lower than or equal to 1 ppb, and the dew point is preferably −111° C.). When a gas having a high purity is used for formation, impurities such as water or hydrogen in the oxide semiconductor layer 144a can be reduced, so that the reliability of electric characteristics of the semiconductor device can be improved.

(High Purification and Substrate Heating in Formation of Oxide Semiconductor Layer)

When the oxide semiconductor layer is formed while the substrate is heated, entry of impurities such as water or hydrogen into the oxide semiconductor layer can be suppressed. The substrate temperature is preferably higher than 200° C. and lower than or equal to 700° C., more preferably higher than 300° C. and lower than or equal to 500° C., still more preferably higher than or equal to 400° C. and lower than or equal to 450° C.

(High Purification and Heat Treatment after Formation of Oxide Semiconductor Layer)

Next, the oxide semiconductor layer is subjected to heat treatment after formation. When heating is performed after formation, the concentration of impurities such as moisture or hydrogen in the oxide semiconductor layer is further lowered. For example, the heat treatment may be performed at a temperature higher than or equal to 250° C. and lower than or equal to 750° C., preferably higher than or equal to 400° C. and lower than the strain point of the substrate. Specifically, the heat treatment may be performed at 500° C. for 3 to 6 minutes. When RTA is used for the heat treatment, dehydration or dehydrogenation can be performed in a short time; thus, the treatment can be performed even at a temperature higher than the strain point of a glass substrate.

(High Purification and Heat Treatment Apparatus after Formation of Oxide Semiconductor Layer)

Note that the apparatus by which the heat treatment is performed after formation of the oxide semiconductor layer is not limited to an electric furnace, and may have a device for heating an object by heat conduction or heat radiation from a heating element such as a resistance heating element. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas that does not react with an object by heat treatment, such as nitrogen or a rare gas such as helium, neon, or argon is used. The purity of a gas which is introduced into the heat treatment apparatus is preferably set to higher than or equal to 6N (99.9999%), more preferably higher than or equal to 7N (99.99999%) (that is, the impurity concentration is preferably lower than or equal to 1 ppm, more preferably lower than or equal to 0.1 ppm).

Through the above described steps, the concentration of impurities such as water or hydrogen in the oxide semiconductor layer is reduced, so that the oxide semiconductor layer can be highly purified. Note that the above-described heat treatment can also be referred to as dehydration treatment, dehydrogenation treatment, or the like. The heat treatment can be performed at the timing, for example, after the oxide semiconductor layer is processed to have an island shape or after the gate insulating layer 146 is formed. Such dehydration treatment or dehydrogenation treatment may be conducted once or plural times.

Next, treatment for supplying oxygen is performed in a manner described below in order to repair oxygen vacancies in the oxide semiconductor layer. As treatment for supplying oxygen, there are a method in which an oxide semiconductor layer is heated in an oxygen atmosphere to be supplied with oxygen and a method in which oxygen contained in a film that is near the oxide semiconductor layer is diffused so that oxygen is supplied to the oxide semiconductor layer. Here, the method is described in which an oxide semiconductor layer is heated in an oxygen atmosphere to be supplied with oxygen. The method in which oxygen is indirectly supplied to the oxide semiconductor layer from a film that is near the oxide semiconductor layer is described in detail in Treatment for Supplying Oxygen from First Insulating Layer or Treatment for Supplying Oxygen from Gate Insulating Layer which are described later.

(Treatment for Supplying Oxygen and Reducing Oxygen Vacancies)

Treatment for supplying oxygen is a treatment in which oxygen vacancies in an oxide semiconductor layer are reduced and carrier density in the oxide semiconductor layer is reduced. The treatment for supplying oxygen is performed on the above-described highly purified oxide semiconductor layer, so that an i-type (intrinsic) or substantially i-type oxide semiconductor layer can be formed.

(Treatment for Supplying Oxygen in Oxygen Atmosphere)

A method in which oxygen is directly supplied to the oxide semiconductor layer is described. A case in which an In—Ga—Zn—O-based metal oxide is used as the oxide semiconductor layer is described. Heat treatment by which impurities, in particular, hydrogen, in the oxide semiconductor layer are reduced is performed and then, oxygen is supplied to the oxide semiconductor layer. The proportion of oxygen contained in the oxide semiconductor layer on which the treatment for supplying oxygen has been performed is preferably higher than or equal to that in the stoichiometric composition (in the case of an In—Ga—Zn—O-based metal oxide, In:Ga:Zn:O=1:1:1:4 in an atomic ratio). Oxygen vacancies serving as donors can be reduced with supply of oxygen, so that a substantially i-type (intrinsic) oxide semiconductor layer can be formed. As a result, a decrease in reliability of electric characteristics of the transistor can be suppressed. The heat treatment for the treatment for supplying oxygen is performed at a temperature of higher than or equal to 100° C. and lower than 350° C., preferably higher than or equal to 150° C. and lower than 250° C., for example. It is preferable that an oxygen gas used for the heat treatment in an oxygen atmosphere do not include water, hydrogen, or the like. Alternatively, the purity of the oxygen gas which is introduced into the heat treatment apparatus is preferably higher than or equal to 6N (99.9999%), more preferably higher than or equal to 7N (99.99999%) (that is, the impurity concentration in the oxygen gas is preferably lower than or equal to 1 ppm, more preferably lower than or equal to 0.1 ppm).

(Treatment for Supplying Oxygen by Ion Implantation Method or Ion Doping Method)

Alternatively, oxygen may be directly added to the oxide semiconductor layer by an ion implantation method, an ion doping method, or the like so that oxygen vacancies serving as donors are reduced. For example, oxygen made to be plasma with a microwave of 2.45 GHz may be added to the oxide semiconductor layer.

(Formation of Source Electrode and Drain Electrode)

Next, the source electrode 142a and the drain electrode 142b are formed in contact with the oxide semiconductor layer with the projection of the first insulating layer 130 interposed between the source electrode 142a and the drain electrode 142b.

(Formation of Stopper Film)

Next, the formation of the stopper film 150 is described. Description in Embodiment 1 can be referred to for the formation of the stopper film 150. In particular, in the case where an oxide semiconductor is used for the wide band gap semiconductor layer 144, the stopper film 150 is preferably formed using silicon or silicon nitride. The reason why silicon or silicon nitride is used is that the later etching for the stopper film can be selectively performed with less damage to the surface of the oxide semiconductor layer. The stopper film 150 can be formed by a sputtering method or a chemical vapor deposition (CVD) method. The stopper film 150 is formed to have a thickness of greater than or equal to 10 nm and less than or equal to 100 nm.

(Formation of Second Insulating Layer)

Description of the manufacturing method in Embodiment 1 can be referred to for steps of formation of a trench to which the second insulating layer 134 is embedded and formation of the second insulating layer 134 to fill the trench. In particular, reliability of electric characteristics of the oxide semiconductor layer is reduced by being affected by moisture or hydrogen entering from the outside; therefore, an insulating layer with passivation properties for blocking moisture or hydrogen is used as the second insulating layer 134. For example, the second insulating layer 134 can be formed using aluminum oxide with high passivation properties.

Description in Embodiment 1 can be referred to for steps from formation of the insulating film 160 up to planarization of the second insulating layer.

The steps up to planarization of the stopper film 150 are performed, so that the oxide semiconductor layer can be formed into an island shape. Further, a structure in which the edge portion of the oxide semiconductor layer is in contact with the second insulating layer 134 can be formed. Further, with the steps from formation of the stopper film 150 to planarization of the second insulating layer 134, the second insulating layer 134 can be formed even when a photolithography step and an etching step are not performed. In particular, it is difficult to perform patterning on a material that is not easily dry etched (e.g., aluminum oxide) by a photolithography step and a dry etching step. When a chemical mechanical polishing (CMP) method is used, however, even an insulating film that is not easily dry etched can be patterned.

(Etching of Stopper Film)

Next, the stopper film 150 is removed by etching. In the case where silicon that has a high etching selection ratio with respect to the oxide semiconductor layer is used for the stopper film 150, the surface of the oxide semiconductor layer is not heavily damaged when the stopper film 150 is etched. Although dry etching or wet etching may be performed as the etching, dry etching is preferable because the stopper film 150 can be selectively etched without severe damage to the surface of the oxide semiconductor layer.

(Formation of Gate Insulating Layer)

Next, the gate insulating layer 146 is formed over the exposed oxide semiconductor layer. The gate insulating layer 146 is formed to have a thickness of greater than or equal to 1 nm and less than or equal to 100 nm and can be formed by a sputtering method, a molecular beam epitaxy (MBE) method, a chemical vapor deposition (CVD) method, a pulsed laser deposition method, an atomic layer deposition (ALD) method, a spin coating method, a printing method, or the like as appropriate. A silicon oxide film of $SiO_{2+\alpha}$ ($\alpha>0$), which contains excess oxygen, is used as a material of the gate insulating layer 146.

Next, as another mode of the above-described treatment for supplying oxygen, a method in which treatment for supplying oxygen is performed from a film formed in contact with the oxide semiconductor layer is described.

(Treatment for Supplying Oxygen from First Insulating Layer)

The treatment for supplying oxygen to the oxide semiconductor layer can also be performed from the first insulating layer 130. When the first insulating layer 130 that contains oxygen and releases part of the oxygen by heating is used, oxygen is supplied from the first insulating layer 130 to the oxide semiconductor layer and oxygen vacancies in the oxide semiconductor layer are repaired, so that an i-type (intrinsic) or substantially i-type oxide semiconductor layer can be formed. Specifically, the first insulating layer 130 can be formed by a sputtering method, a molecular beam epitaxy (MBE) method, a chemical vapor deposition (CVD) method, a pulsed laser deposition method, an atomic layer deposition (ALD) method, a coating method, a printing method, or the like as appropriate. The first insulating layer 130 is formed using a silicon oxide film of $SiO_{2+\alpha}$ ($\alpha>0$), which contains excess oxygen, with a thickness of greater than or equal to 100 nm and less than or equal to 500 nm. Heat treatment for diffusing oxygen contained in the first insulating layer 130 into the oxide semiconductor layer can be performed after the oxide semiconductor layer is formed over the first insulating layer 130 or after the gate insulating layer 146 is formed. The heat treatment is performed in an oxygen atmosphere at a temperature of higher than or equal to 100° C. and lower than 350° C., preferably higher than or equal to 150° C. and lower than 250° C., for example. It is preferable that an oxygen gas used for the heat treatment in an oxygen atmosphere do not include water, hydrogen, or the like. Alternatively, the purity of the oxygen gas which is introduced into the heat treatment apparatus is preferably higher than or equal to 6N (99.9999%), more preferably higher than or equal to 7N (99.99999%) (that is, the impurity concentration in the oxygen gas is preferably lower than or equal to 1 ppm, more preferably lower than or equal to 0.1 ppm). Note that the heat treatment for supplying oxygen contained in the first insulating layer 130 to the oxide semiconductor layer can be performed before the gate insulating layer 146 is formed.

(Treatment for Supplying Oxygen from Gate Insulating Layer)

The treatment for supplying oxygen to the oxide semiconductor layer can also be performed from the gate insulating layer 146. When an insulating film containing oxygen is used as the gate insulating layer 146, oxygen contained in the gate insulating layer 146 is diffused into the oxide semiconductor layer by the heat treatment; thus, oxygen vacancies in the oxide semiconductor layer can be reduced. Specifically, the gate insulating layer 146 can be formed by a sputtering method, a molecular beam epitaxy (MBE) method, a chemical vapor deposition (CVD) method, a pulsed laser deposition method, an atomic layer deposition (ALD) method, a coating method, a printing method, or the like as appropriate. The gate insulating layer 146 is formed using a silicon oxide film of $SiO_{2+\alpha}$ ($\alpha>0$), which contains excess oxygen, with a thickness of greater than or equal to 1 nm and less than or equal to 100 nm. The heat treatment for diffusing oxygen contained in the gate insulating layer 146 into the oxide semiconductor layer is preferably performed after the gate insulating layer 146 is formed. The heat treatment is performed in an oxygen atmosphere at a temperature of higher than or equal to 100° C. and lower than 350° C., preferably higher than or equal to 150° C. and lower than 250° C., for example. It is preferable that an oxygen gas used for the heat treatment in an oxygen atmosphere do not include water, hydrogen, or the like. Alternatively, the purity of the oxygen gas which is introduced into the heat treatment apparatus is preferably higher than or equal to 6N (99.9999%), more preferably higher than or equal to 7N (99.99999%) (that is, the impurity concentration in the oxygen gas is preferably lower than or equal to 1 ppm, more preferably lower than or equal to 0.1 ppm).

Oxygen vacancies in the oxide semiconductor layer are reduced by the above-described treatment for supplying oxygen, so that the carrier density can be reduced.

(Formation of Gate Electrode)

In the case where the gate electrode 148 has a single layer structure, description in Embodiment 1 can be referred to for formation of the gate electrode 148. When threshold voltage control is performed on the above-described transistor including an oxide semiconductor layer, the gate electrode 148 is formed using a material with a work function of 5 eV or higher, preferably 5.5 eV or higher. Specifically, a metal oxide film containing nitrogen and an In—Ga—Zn—O film containing nitrogen can be formed by a sputtering method.

Through the above steps, the transistor 162 in which the wide band gap semiconductor layer 144 in Embodiment 1 is formed using an oxide semiconductor can be manufactured.

As described above, the transistor 162 described in this embodiment includes an oxide semiconductor layer with fewer impurities obtained by the step for removing impurities such as water or hydrogen in the oxide semiconductor layer. Further, oxygen is directly supplied to the oxide semiconductor layer or oxygen is indirectly supplied to the oxide semiconductor layer from the first insulating layer 130 and the gate insulating layer 146, so that oxygen vacancies in the oxide semiconductor layer are repaired, so that an i-type (intrinsic) or substantially i-type oxide semiconductor layer can be formed. As a result, the transistor 162 in which a decrease or a variation in electric characteristics is not easily caused can be manufactured.

Further, in the transistor 162 described in this embodiment, as in the transistor in Embodiment 1, the edge portion of the oxide semiconductor layer is in contact with the second insulating layer 134 with passivation properties. Thus, entry of external atmospheric components, specifically moisture or hydrogen, from the edge portion of the oxide semiconductor layer can be prevented, whereby the transistor 162 in which a decrease or a variation in electric characteristics is not easily caused can be manufactured.

Further, when a manufacturing method described in this embodiment and using the stopper film 150 is employed, the stopper film 150 can be selectively etched without severe damage to the surface of the oxide semiconductor layer; thus, the transistor 162 in which a decrease or a variation in electric characteristics is not easily caused can be manufactured.

An insulating film that is not easily patterned by dry etching can be patterned with employment of the manufacturing method of the transistor 162. Further, the transistor 162 can be isolated by the insulating film. Thus, leakage current flowing between adjacent transistors can be reduced.

Embodiment 3

In this embodiment, a structure and a manufacturing method in the case where a c-axis aligned crystalline (CAAC) oxide semiconductor layer is used for the wide band gap semiconductor layer 144 of the semiconductor device described in Embodiment 1 are described. Note that a CAAC oxide semiconductor layer is described in detail in Structure Example of Semiconductor Device.

A semiconductor device described in this embodiment is different from the semiconductor device described in Embodiment 1 in structures of the first insulating layer 130, a CAAC oxide semiconductor layer, the gate insulating layer 146, the gate electrode 148, and the stopper film 150. Thus, in this embodiment, structures and manufacturing methods of the first insulating layer 130, the CAAC oxide semiconductor layer, the gate insulating layer 146, the gate electrode 148, and the stopper film 150 are described. Description in Embodiment 1 can be referred to for the structures and the manufacturing methods of the source and drain electrodes, the insulating film 160, the trench, and the description is omitted here.

In the semiconductor device described in this embodiment, an edge portion of the CAAC oxide semiconductor layer is in contact with the second insulating layer; thus, it is difficult that external moisture or atmospheric components enters from the edge portion into the CAAC oxide semiconductor layer. As a result, a semiconductor device in which a decrease or a variation in electric characteristics is not easily caused can be provided.

<Structure Example of Semiconductor Device Including CAAC Oxide Semiconductor Layer>

Next, a structure of a semiconductor device of one embodiment of the present invention is described. Specifically, a structure of a semiconductor device including a CAAC oxide semiconductor layer is described.

(CAAC Oxide Semiconductor Layer)

First, a CAAC oxide semiconductor layer is described. In this embodiment, an oxide including a crystal with c-axis alignment, which has a triangular or hexagonal atomic arrangement when seen from the direction of an a-b plane, a surface, or an interface is described. In the crystals, metal atoms are arranged in a layered manner, or metal atoms and oxygen atoms are arranged in a layered manner along the c-axis, and the directions of the a-axis or the b-axis in the a-b plane are different (the crystal rotates around the c-axis). Such an oxide is also referred to as a c-axis aligned crystalline (CAAC) oxide semiconductor layer.

In a broad sense, a CAAC oxide semiconductor layer means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC oxide semiconductor layer is not a single crystal oxide, but is not composed of only an amorphous component. Although the CAAC oxide semiconductor layer includes a crystallized portion (crystalline portion), a boundary between one crystalline portion and another crystalline portion is not clearly distinguished in some cases.

Nitrogen may be substituted for part of oxygen included in the CAAC oxide semiconductor layer. The c-axes of individual crystalline portions included in the CAAC oxide semiconductor layer may be aligned in one direction (e.g., a direction perpendicular to a surface of a substrate over which the CAAC oxide semiconductor layer is formed or a surface of the CAAC oxide semiconductor layer). Alternatively, the normals of the a-b planes of the individual crystalline portions included in the CAAC oxide semiconductor layer may be aligned in one direction (e.g., a direction perpendicular to a surface of a substrate over which the CAAC oxide semiconductor layer is formed or a surface of the CAAC oxide semiconductor layer).

The CAAC oxide semiconductor layer becomes a conductor, a semiconductor, or an insulator depending on its composition or the like. The CAAC oxide semiconductor layer transmits or does not transmit visible light depending on its composition or the like.

As an example of such a CAAC oxide semiconductor layer, there is an oxide that is formed into a film shape and has a triangular or hexagonal atomic arrangement when observed from the direction perpendicular to a surface of the film or a surface of a substrate over which the oxide is formed, and in which metal atoms are arranged in a layered manner or metal atoms and oxygen atoms (or nitrogen atoms) are arranged in a layered manner when a cross section of the film is observed.

An example of a crystal structure of the CAAC oxide semiconductor layer is described in detail with reference to FIGS. 9A to 9E, FIGS. 10A to 10C, and FIGS. 11A to 11C. In FIGS. 9A to 9E, FIGS. 10A to 10C, and FIGS. 11A to 11C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 9A to 9E, O surrounded by a circle represents tetracoordinate O and O surrounded by a double circle represents tricoordinate O.

Figure 9A:
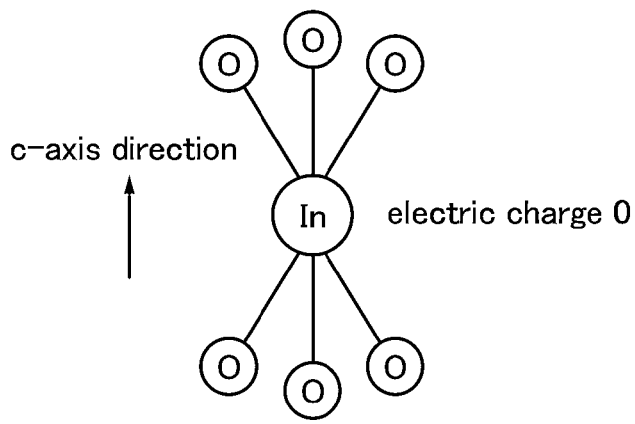
FIGS. 9A to 9E illustrate a crystal structure of an oxide material according to one embodiment of the present invention.

FIG. 9A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 9A is actually an octahedral structure, but is illustrated as a planar structure for simplicity. Note that three tetracoordinate O atoms exist in each of an upper half and a lower half in FIG. 9A. In the small group illustrated in FIG. 9A, electric charge is 0.

Figure 9D:
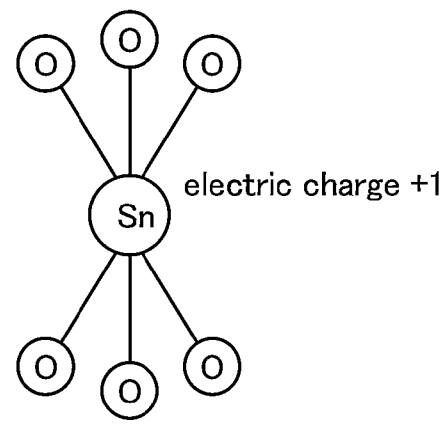
Figure 9B:
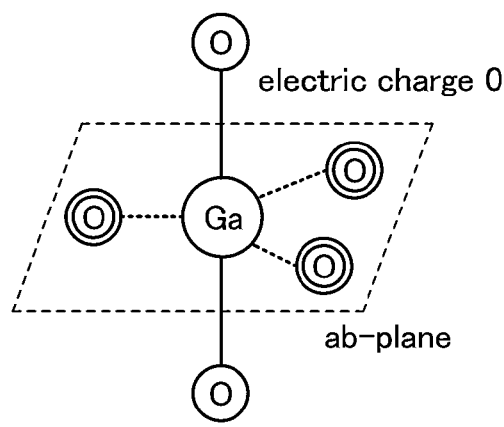

FIG. 9B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 9B. An In atom can also have the structure illustrated in FIG. 9B because an In atom can have five ligands. In the small group illustrated in FIG. 9B, electric charge is 0.

Figure 9E:
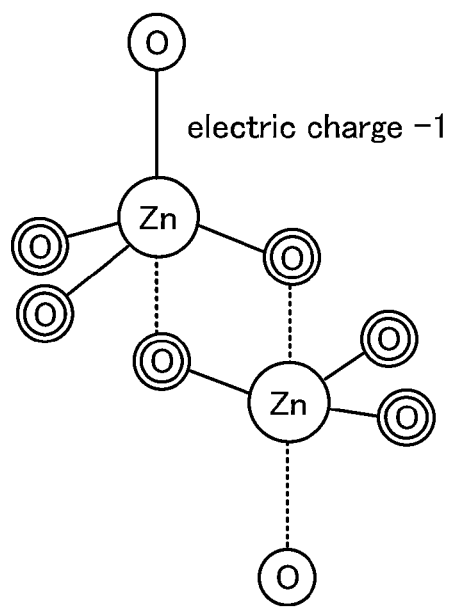
Figure 9C:
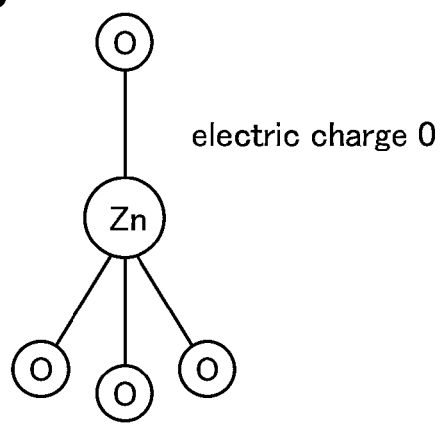

FIG. 9C illustrates a structure including one tetracoordinate Zn atom and four tetracoordinate O atoms proximate to the Zn atom. In FIG. 9C, three tetracoordinate O atom exists in an upper half and one tetracoordinate O atoms exist in a lower half. In the small group illustrated in FIG. 9C, electric charge is 0.

FIG. 9D illustrates a structure including one hexacoordinate Sn atom and six tetracoordinate O atoms proximate to the Sn atom. In FIG. 9D, three tetracoordinate O atoms exist in each of an upper half and a lower half. In the small group illustrated in FIG. 9D, electric charge is +1.

FIG. 9E illustrates a small group including two Zn atoms. In FIG. 9E, one tetracoordinate O atom exists in each of an upper half and a lower half. In the small group illustrated in FIG. 9E, electric charge is −1.

Here, a plurality of small groups form a medium group, and a plurality of medium groups form a large group (also referred to as a unit cell).

Now, a rule of bonding between the small groups is described. The three O atoms in the upper half with respect to the hexacoordinate In atom each have three proximate In atoms in the downward direction, and the three O atoms in the lower half have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom, or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 10A:
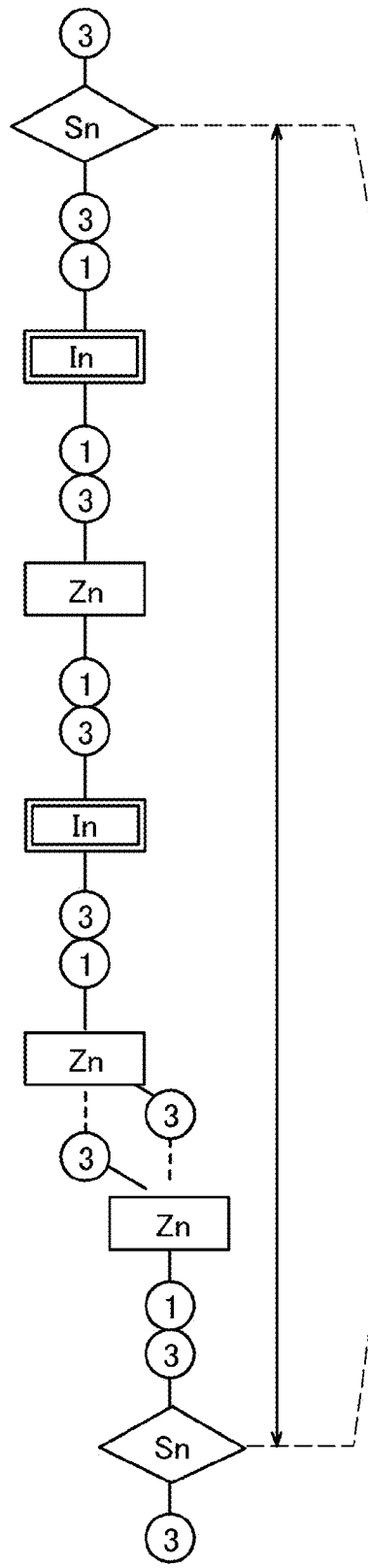
FIGS. 10A to 10C illustrate a crystal structure of an oxide material according to one embodiment of the present invention.
Figure 10B:
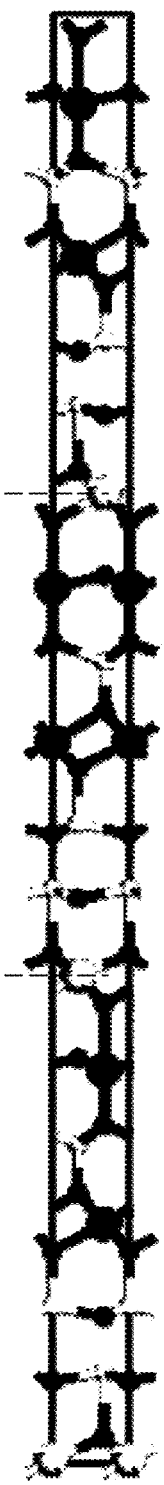
Figure 10C:
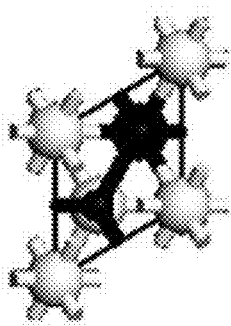

FIG. 10A illustrates a model of a medium group included in a layered structure of an In—Sn—Zn—O-based material. FIG. 10B illustrates a large group including three medium groups. Note that FIG. 10C illustrates an atomic arrangement in the case where the layered structure in FIG. 10B is observed from the c-axis direction.

In FIG. 10A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 10A, one tetracoordinate O atom existing in each of an upper half and a lower half with respect to an In atom is denoted by circled 1. FIG. 10A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 10A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 9E can be given. For example, with one small group including two Zn atoms, electric charge of one small group including a Sn atom can be cancelled, so that the total electric charge of the layered structure can be 0.

When the large group illustrated in FIG. 10B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 11A:
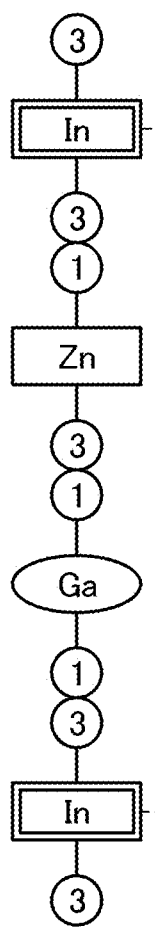
FIGS. 11A to 11C illustrate a crystal structure of an oxide material according to one embodiment of the present invention.

As an example, FIG. 11A illustrates a model of a medium group included in a layered structure of an In—Ga—Zn—O-based material.

In the medium group included in the layered structure of the In—Ga—Zn—O-based material in FIG. 11A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 11B:
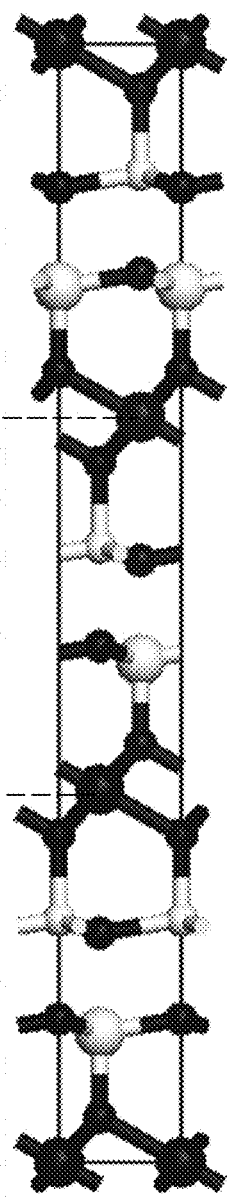
Figure 11C:
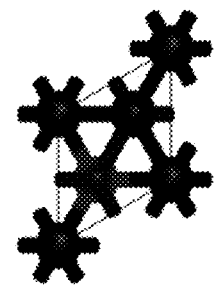

FIG. 11B illustrates a large group including three medium groups. Note that FIG. 11C illustrates an atomic arrangement in the case where the layered structure in FIG. 11B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 11A but also a medium group in which the arrangement of the In atom, the Ga atom, and the Zn atom is different from that in FIG. 11A.

Specifically, when the large group illustrated in FIG. 11B is repeated, an In—Ga—Zn—O-based material can be obtained. Note that a layered structure of the obtained In—Ga—Zn—O-based material can be expressed as a composition formula, $InGaO_3(ZnO)_n$ (n is a natural number).

Figure 13A:
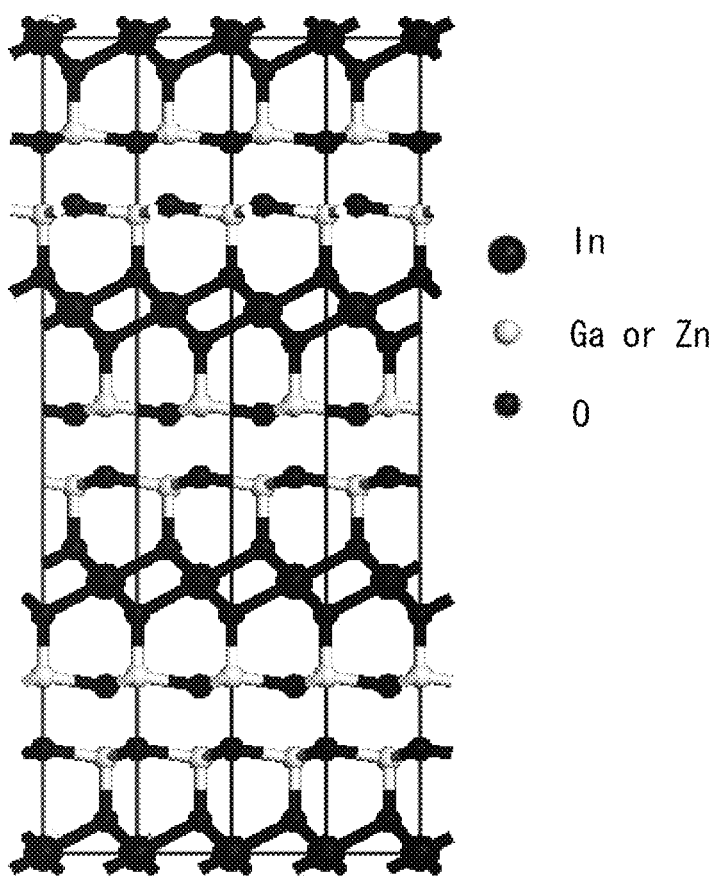
FIGS. 13A and 13B each illustrate a crystal structure of an oxide material according to one embodiment of the present invention.

In the case where n=1 ($InGaZnO_4$), a crystal structure illustrated in FIG. 13A can be obtained, for example. Note that in the crystal structure in FIG. 13A, a Ga atom and an In atom each have five ligands as described in FIG. 9B, a structure in which Ga is replaced with In can be obtained.

Figure 13B:
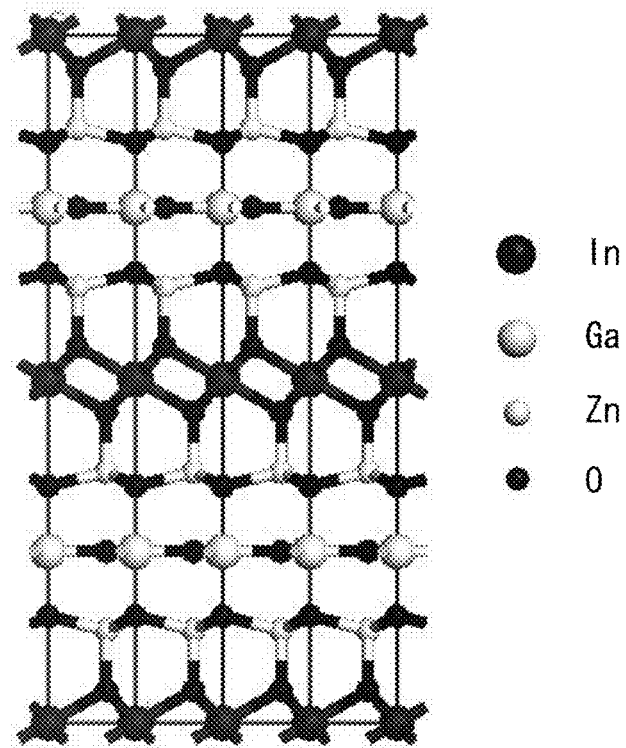

In the case where n=2 ($InGaZn_2O_5$), a crystal structure illustrated in FIG. 13B can be obtained, for example. Note that in the crystal structure in FIG. 13B, a Ga atom and an In atom each have five ligands as described in FIG. 9B, a structure in which Ga is replaced with In can be obtained.

(First Insulating Layer)

Next, the first insulating layer 130 is described. The first insulating layer 130 has a projection. The first insulating layer 130 can be formed using a silicon oxide film, a gallium oxide film, an aluminum oxide film, a silicon nitride film, a silicon oxynitride film, an aluminum oxynitride film, or a silicon nitride oxide film. As the first insulating layer 130, an insulating layer which contains oxygen and from which part of the oxygen is released by heating is preferably used.

(Gate Insulating Layer)

An insulating film can be used as the gate insulating layer 146. Specifically, an insulating film formed using silicon oxide, hafnium oxide, yttrium oxide, hafnium silicate, hafnium aluminate, hafnium silicate to which nitrogen is added, hafnium aluminate to which nitrogen is added, lanthanum oxide, or the like can be used. It is preferable to form the gate insulating layer 146 using an insulating layer which contains oxygen and from which part of the oxygen is released by heating.

An insulating film from which impurities such as hydrogen are sufficiently removed is preferably used as the gate insulating layer 146, so that a decrease in reliability of electric characteristics of the transistor due to diffusion of impurities such as hydrogen in the gate insulating layer 146 into the CAAC oxide semiconductor layer is prevented.

(Second Insulating Layer)

Next, the second insulating layer 134 is described. The second insulating layer 134 is an insulating film with passivation properties for blocking moisture or hydrogen. The second insulating layer 134 is provided to be in contact with the edge portion of the CAAC oxide semiconductor layer, so that entry of external moisture or atmospheric components from the edge portion to the inside of the CAAC oxide semiconductor layer can be prevented. Electric reliability of the transistor including the CAAC oxide semiconductor can be increased when entry of external moisture or atmospheric components to the inside of the CAAC oxide semiconductor layer is prevented. For the second insulating layer with passivation properties, aluminum oxide, aluminum nitride oxide, aluminum nitride, silicon nitride, gallium oxide, gallium nitride, or the like can be used.

(Gate Electrode)

Next, the gate electrode 148 is described. In the case where the gate electrode 148 has a single layer structure, description in Embodiment 1 can be referred to for the material of the gate electrode 148.

Note that in order to make the threshold voltage of the semiconductor device shift to the positive side and make the semiconductor device be a so-called normally-off switching element, the gate electrode 148 needs to have an appropriate work function on a side in contact with the gate insulating layer 146. When such threshold voltage control is performed on the semiconductor device, the work function of the gate electrode 148 needs to be 5 eV or higher, preferably 5.5 eV or higher. For such a conductive film having a high work function, a metal oxide containing nitrogen is preferably used.

Specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film is preferably used.

In the case where the gate electrode 148 has a stacked structure, one of layers of the gate electrode 148 that is in contact with the gate insulating layer 146 is preferably formed using a material having a high work function. In particular, as the one of the layers of the gate electrode 148 that is in contact with the gate insulating layer 146, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film is preferably used. These films have a work function of 5 eV or higher, preferably 5.5 eV or higher, and the use of any of these films as the gate electrode makes the threshold voltage of electric characteristics of the transistor positive. Accordingly, a so-called normally-off switching element can be obtained.

<Manufacturing Method of Semiconductor Device Including CAAC Oxide Semiconductor Layer>

Next, a manufacturing method of a semiconductor device including a CAAC oxide semiconductor layer of one embodiment of the present invention is described.

(Formation of Projection of First Insulating Layer)

First, after the first insulating layer 130 is formed over a substrate, a projection is formed.

The first insulating layer 130 is formed to have a thickness of greater than or equal to 100 nm and less than or equal to 500 nm and can be formed by a sputtering method, a molecular beam epitaxy (MBE) method, a chemical vapor deposition (CVD) method, a pulsed laser deposition method, an atomic layer deposition (ALD) method, a coating method, a printing method, or the like as appropriate. Specifically, the first insulating layer 130 is formed using a silicon oxide film of $SiO_{2+\alpha}$ ($\alpha>0$), which contains excess oxygen. The projection may be formed using a known technique; for example, the projection can be formed in a single etching step or through a plurality of etching steps.

(Formation of CAAC Oxide Semiconductor Layer)

Next, a method for forming a CAAC oxide semiconductor layer is described. When an oxide semiconductor layer is formed while the substrate is heated, a CAAC oxide semiconductor layer is formed. Here, the substrate temperature is preferably higher than 170° C. and lower than or equal to 700° C., more preferably higher than 300° C. and lower than or equal to 500° C., still more preferably higher than or equal to 400° C. and lower than or equal to 450° C. The CAAC oxide semiconductor layer has a thickness of greater than or equal to 1 nm and less than or equal to 100 nm, and can be formed by a sputtering method, a molecular beam epitaxy (MBE) method, a pulsed laser deposition method, an atomic layer deposition (ALD) method, or the like as appropriate.

The CAAC oxide semiconductor layer may be formed using a sputtering system that performs film formation with surfaces of a plurality of substrates set substantially perpendicular to a surface of a sputtering target, which is a so called columnar plasma (CP) sputtering system.

(Atmosphere in Formation of CAAC Oxide Semiconductor Layer)

When the CAAC oxide semiconductor layer is formed with the use of a gas having high purity, the CAAC oxide semiconductor layer can includes fewer impurities such as water or hydrogen that are included in the CAAC oxide semiconductor layer and affect the electric characteristics. The CAAC oxide semiconductor layer may be formed in a rare gas (typically argon) atmosphere, an oxygen atmosphere, a mixed atmosphere containing a rare gas and oxygen, or the like. Moreover, it is preferable to employ an atmosphere using a high-purity gas from which impurities such as hydrogen, water, hydroxide, or a hydride are removed, in order to prevent hydrogen, water, hydroxide, a hydride, or the like from entering the CAAC oxide semiconductor layer. Specifically, the purity of the argon is preferably higher than or equal to 8N (99.999999%), more preferably higher than or equal to 9N (99.9999999%) (that is, the concentration of $H_2O$ is preferably lower than or equal to 1 ppb, preferably lower than or equal to 0.1 ppb, the concentration of $H_2$ is 5 preferably ppb, more preferably lower than or equal to 0.5 ppb, and the dew point is preferably −121° C.). The purity of the oxygen is preferably higher than or equal to 7N (99.99999%), more preferably higher than or equal to 8N (99.999999%) (that is, the concentration of $H_2O$ is preferably lower than or equal to 10 ppb, more preferably lower than or equal to 1 ppb, the concentration of $H_2$ is preferably 10 ppb, more preferably lower than or equal to 1 ppb, and the dew point is preferably −111° C.).

(High Purification and Heat Treatment after Formation of CAAC Oxide Semiconductor Layer)

Next, the CAAC oxide semiconductor layer is subjected to heat treatment after formation. When heating is performed after formation, the impurities such as moisture or hydrogen are further reduced. Specifically, the heat treatment may be performed at a temperature higher than or equal to 250° C. and lower than or equal to 750° C., preferably higher than or equal to 400° C. and lower than the strain point of the substrate. For example, the heat treatment may be performed at 500° C. for 3 to 6 minutes. When RTA is used for the heat treatment, dehydration or dehydrogenation can be performed in a short time; thus, the treatment can be performed even at a temperature higher than the strain point of a glass substrate.

(High Purification of CAAC Oxide Semiconductor Layer and Heat Treatment Apparatus After Formation)

Note that the heat treatment apparatus is not limited to an electric furnace, and may have a device for heating an object by heat conduction or heat radiation from a heating element such as a resistance heating element. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for the heat treatment using a high-temperature gas. As the gas, an inert gas that does not react with an object by the heat treatment, such as nitrogen or a rare gas such as helium, neon, or argon is used. The purity of a gas which is introduced into a heat treatment apparatus is set to preferably higher than or equal to 6N (99.9999%), more preferably higher than or equal to 7N (99.99999%) (that is, the impurity concentration is preferably lower than or equal to 1 ppm, more preferably lower than or equal to 0.1 ppm).

Note that the above-described heat treatment can also be referred to as dehydration treatment, dehydrogenation treatment, or the like. The heat treatment can be performed at the timing, for example, after the CAAC oxide semiconductor layer is separated into or after the gate insulating layer 146 is formed. Such dehydration treatment or dehydrogenation treatment may be conducted once or plural times.

Treatment for supplying oxygen by which oxygen is supplied to the CAAC oxide semiconductor layer may be performed. As the treatment for supplying oxygen, there are a method in which a CAAC oxide semiconductor layer is heated in an oxygen atmosphere to be supplied with oxygen and a method in which oxygen contained in a film that is near the CAAC oxide semiconductor layer is diffused so that oxygen is supplied to the CAAC oxide semiconductor layer. The method in which a CAAC oxide semiconductor layer is heated in an oxygen atmosphere to be supplied with oxygen is described below. The method in which oxygen is indirectly supplied to the CAAC oxide semiconductor layer from a film that is near the CAAC oxide semiconductor layer is described in detail in Treatment for Supplying Oxygen from First Insulating Layer or Treatment for Supplying Oxygen from Gate Insulating Layer which are described later.

(Treatment for Supplying Oxygen in Oxygen Atmosphere)

A method is described in which a CAAC oxide semiconductor layer is heated in an oxygen atmosphere to be supplied with oxygen. In the case where an In—Ga—Zn—O-based metal oxide is used for the CAAC oxide semiconductor layer, the proportion of oxygen contained in the CAAC oxide semiconductor layer is preferably higher than or equal to that in the stoichiometric composition (in the case of an In—Ga—Zn—O-based metal oxide, In:Ga:Zn:O=1:1:1:4 in an atomic ratio). When the treatment for supplying oxygen is performed, the electric characteristics of the transistor are improved. The heat treatment for the treatment for supplying oxygen is performed at a temperature of higher than or equal to 100° C. and lower than 350° C., preferably higher than or equal to 150° C. and lower than 250° C., for example. It is preferable that an oxygen gas used for the heat treatment in an oxygen atmosphere do not include water, hydrogen, or the like. Alternatively, the purity of the oxygen gas which is introduced into the heat treatment apparatus is preferably higher than or equal to 6N (99.9999%), more preferably higher than or equal to 7N (99.99999%) (that is, the impurity concentration in the oxygen gas is preferably lower than or equal to 1 ppm, more preferably lower than or equal to 0.1 ppm).

(Treatment for Supplying Oxygen by Ion Implantation Method or Ion Doping Method)

Alternatively, oxygen may be directly added to the CAAC oxide semiconductor layer by an ion implantation method, an ion doping method, or the like. For example, oxygen made to be plasma with a microwave of 2.45 GHz may be added to the CAAC oxide semiconductor layer.

(Formation of Source Electrode and Drain Electrode)

Next, the source electrode 142a and the drain electrode 142b are formed to be electrically connected to the CAAC oxide semiconductor layer. The source electrode 142a and the drain electrode 142b are formed in contact with the CAAC oxide semiconductor layer with the projection of the first insulating layer interposed between the source electrode 142a and the drain electrode 142b.

(Formation of Stopper Film)

Next, the formation of the stopper film 150 is described. Description in Embodiment 1 can be referred to for the formation of the stopper film 150. In particular, in the case where a CAAC oxide semiconductor layer is used for the wide band gap semiconductor layer 144, the stopper film 150 is preferably formed using silicon or silicon nitride. The reason why silicon or silicon nitride is used is that the later etching for the stopper film can be selectively performed with less damage to the surface of the CAAC oxide semiconductor layer. The stopper film 150 can be formed by a sputtering method or a chemical vapor deposition (CVD) method. The stopper film 150 is formed to have a thickness of greater than or equal to 10 nm and less than or equal to 100 nm.

(Formation of Second Insulating Layer)

Description of the manufacturing method in Embodiment 1 can be referred to for the steps of formation of a trench to which the second insulating layer 134 is embedded and formation of the second insulating layer 134 to fill the trench. In particular, in the case where the CAAC oxide semiconductor layer is used for the wide band gap semiconductor layer 144, an insulating layer with passivation properties for blocking moisture or hydrogen is used as the second insulating layer 134. Specifically, an insulating film with high passivation properties can be formed using aluminum oxide by a sputtering method.

Description in Embodiment 1 can be referred to for the steps from formation of the insulating film 160 to planarization of the second insulating layer.

The steps up to planarization of the stopper film 150 are performed, so that the CAAC oxide semiconductor layer can be formed into an island shape. Further, a structure in which the edge portion of the CAAC oxide semiconductor layer is in contact with the second insulating layer 134 can be formed. Further, with the steps from formation of the stopper film 150 to planarization of the second insulating layer 134, the second insulating layer 134 can be formed even when a photolithography step and an etching step are not performed. In particular, it is difficult to perform patterning on a material that is not easily dry etched, such as aluminum oxide, by a photolithography step and dry etching. When the chemical mechanical polishing (CMP) method is used, however, even an insulating film that is not easily dry etched can be patterned.

(Etching of Stopper Film)

Next, the stopper film 150 is removed by etching. In the case where silicon that has a high etching selection ratio with respect to the CAAC oxide semiconductor layer is used as the stopper film 150, the surface of the CAAC oxide semiconductor layer is not heavily damaged when the stopper film 150 is etched. Note that dry etching or wet etching can be performed as the etching, and dry etching is preferable because the stopper film 150 can be selectively etched without severe damage to the surface of the CAAC oxide semiconductor layer.

(Formation of Gate Insulating Layer)

Next, the gate insulating layer 146 is formed over the exposed CAAC oxide semiconductor layer. The gate insulating layer 146 is formed to have a thickness of greater than or equal to 1 nm and less than or equal to 100 nm and can be formed by a sputtering method, a molecular beam epitaxy (MBE) method, a chemical vapor deposition (CVD) method, a pulsed laser deposition method, an atomic layer deposition (ALD) method, a spin coating method, a printing method, or the like as appropriate. A silicon oxide film of $SiO_{2+\alpha}$ ($\alpha>0$), which contains excess oxygen, is used as a material of the gate insulating layer 146.

Treatment for supplying oxygen may be performed from a film formed in contact with the CAAC oxide semiconductor layer. Hereinafter, the method is described.

(Treatment for Supplying Oxygen from First Insulating Layer)

The treatment for supplying oxygen to the CAAC oxide semiconductor layer can be performed from the first insulating layer 130. When the first insulating layer 130 that contains oxygen and releases part of the oxygen by heating is used, oxygen is supplied from the first insulating layer 130 to the CAAC oxide semiconductor layer. For example, the first insulating layer 130 can be formed by a sputtering method, a molecular beam epitaxy (MBE) method, a chemical vapor deposition (CVD) method, a pulsed laser deposition method, an atomic layer deposition (ALD) method, a coating method, a printing method, or the like as appropriate. The first insulating layer 130 is preferably formed to have a thickness of greater than or equal to 100 nm and less than or equal to 500 nm. A silicon oxide film of $SiO_{2+\alpha}$ ($\alpha>0$), which contains excess oxygen, is used as a material of the first insulating layer 130. Heat treatment for diffusing oxygen contained in the first insulating layer 130 into the CAAC oxide semiconductor layer is performed after the CAAC oxide semiconductor layer is formed over the first insulating layer 130 or after the gate insulating layer 146 is formed. The heat treatment is performed in an oxygen atmosphere at a temperature of higher than or equal to 100° C. and lower than 350° C., preferably higher than or equal to 150° C. and lower than 250° C., for example. It is preferable that an oxygen gas used for the heat treatment in an oxygen atmosphere do not include water, hydrogen, or the like. Alternatively, the purity of the oxygen gas which is introduced into the heat treatment apparatus is preferably higher than or equal to 6N (99.9999%), more preferably higher than or equal to 7N (99.99999%) (that is, the impurity concentration in the oxygen gas is preferably lower than or equal to 1 ppm, more preferably lower than or equal to 0.1 ppm). Note that a step for supplying oxygen contained in the first insulating layer 130 to the CAAC oxide semiconductor layer can be performed before the gate insulating layer 146 is formed.

(Treatment for Supplying Oxygen from Gate Insulating Layer)

The treatment for supplying oxygen to the CAAC oxide semiconductor layer can be performed from the gate insulating layer 146. When an insulating film containing oxygen is used as the gate insulating layer 146, oxygen contained in the gate insulating layer 146 is diffused into the CAAC oxide semiconductor layer; thus, oxygen can be supplied to the CAAC oxide semiconductor layer. For example, the gate insulating layer 146 can be formed by a sputtering method, a molecular beam epitaxy (MBE) method, a chemical vapor deposition (CVD) method, a pulsed laser deposition method, an atomic layer deposition (ALD) method, a coating method, a printing method, or the like as appropriate. The gate insulating layer 146 is formed to have a thickness of greater than or equal to 1 nm and less than or equal to 100 nm and can be formed using a silicon oxide film of $SiO_{2+\alpha}$ ($\alpha>0$), which contains excess oxygen. The heat treatment for diffusing oxygen contained in the gate insulating layer 146 into the CAAC oxide semiconductor layer is preferably performed after the gate insulating layer 146 is formed. The heat treatment is performed in an oxygen atmosphere at a temperature of higher than or equal to 100° C. and lower than 350° C., preferably higher than or equal to 150° C. and lower than 250° C., for example. It is preferable that an oxygen gas used for the heat treatment in an oxygen atmosphere do not include water, hydrogen, or the like. Alternatively, the purity of the oxygen gas which is introduced into the heat treatment apparatus is preferably higher than or equal to 6N (99.9999%), more preferably higher than or equal to 7N (99.99999%) (that is, the impurity concentration in the oxygen gas is preferably lower than or equal to 1 ppm, more preferably lower than or equal to 0.1 ppm).

Oxygen can be supplied to the CAAC oxide semiconductor layer by the above-described treatment for supplying oxygen.

(Formation of Gate Electrode)

In the case where the gate electrode 148 has a single layer structure, description in Embodiment 1 can be referred to for formation of the gate electrode 148. When threshold voltage control is performed on the above-described transistor including a CAAC oxide semiconductor layer, the work function of the gate electrode 148 needs to be 5 eV, preferably 5.5 eV or higher. For example, a metal oxide containing nitrogen or an In—Ga—Zn—O film containing nitrogen can be formed by a sputtering method.

As described above, a CAAC oxide semiconductor layer is used for the wide band gap semiconductor layer 144 so that the transistor 162 described in this embodiment in which a decrease or a variation in electric characteristics is not easily caused can be manufactured.

Further, in the transistor 162 described in this embodiment, as in the transistor in Embodiment 1, the edge portion of the CAAC oxide semiconductor layer is in contact with the second insulating layer 134 with passivation properties. Thus, entry of external atmospheric components, specifically moisture or hydrogen, from the edge portion of the CAAC oxide semiconductor layer is prevented, and the transistor 162 in which a decrease or a variation in electric characteristics is not easily caused can be manufactured.

Further, when a manufacturing method of the semiconductor device using the stopper film 150 is employed, the stopper film 150 can be selectively etched without severe damage to the surface of the CAAC oxide semiconductor layer; thus, the transistor 162 in which a decrease or a variation in electric characteristics is not easily caused can be manufactured.

An insulating film that is not easily etched by dry etching can be patterned with employment of the manufacturing method of the transistor 162. Further, the transistor 162 can be isolated by the insulating film. Thus, leakage current flowing between adjacent transistors can be reduced.

This application is based on Japanese Patent Application serial No. 2011-108052 filed with Japan Patent Office on May 13, 2011, the entire contents of which are hereby incorporated by reference.

What is claimed is:

1. A semiconductor device comprising:
    a first insulating layer including a projection and a trench;
    a semiconductor layer over the first insulating layer, the semiconductor layer including a semiconductor whose band gap is wider than a band gap of silicon;
    a second insulating layer in contact with a side surface of the semiconductor layer, a lower part of the second insulating layer embedded into the trench of the first insulating layer;
    a third insulating layer over the semiconductor layer;
    a gate electrode over the third insulating layer; and
    a source electrode and a drain electrode which are electrically connected to the semiconductor layer, wherein the projection is interposed between the source electrode and the drain electrode,
    wherein a part of the semiconductor layer is interposed between a side surface of the projection and the gate electrode.

2. The semiconductor device according to claim 1, wherein a whole side surface of the semiconductor layer is in contact with the second insulating layer.

3. The semiconductor device according to claim 1, wherein a top surface of the semiconductor layer is located lower than a top surface of the second insulating layer and higher than a top surface of the projection.

4. The semiconductor device according to claim 1, wherein the semiconductor is an oxide semiconductor.

5. The semiconductor device according to claim 1, wherein the second insulating layer extends along an edge of the semiconductor layer.

6. The semiconductor device according to claim 1, wherein the second insulating layer includes any one of aluminum oxide, aluminum oxynitride, aluminum nitride, silicon nitride, gallium oxide, and gallium nitride.

7. The semiconductor device according to claim 1, wherein the semiconductor is an In—Ga—Zn-based oxide.

8. The semiconductor device according to claim 1, wherein the trench of the first insulating layer surrounds the semiconductor layer.

9. A semiconductor device comprising:
   a first insulating layer including a projection and a trench;
   a semiconductor layer over and in contact with the first insulating layer, the semiconductor layer including a semiconductor whose band gap is wider than a band gap of silicon, wherein the semiconductor layer has an island shape;
   a second insulating layer in contact with a side surface of the semiconductor layer, a lower part of the second insulating layer embedded into the trench of the first insulating layer;
   a gate insulating layer over and in contact with the semiconductor layer and the second insulating layer;
   a gate electrode over and in contact with the gate insulating layer; and
   a source electrode and a drain electrode which are electrically connected to the semiconductor layer, wherein the projection is interposed between the source electrode and the drain electrode,
   wherein a part of the semiconductor layer is interposed between a side surface of the projection and the gate electrode, and
   wherein a top surface of the semiconductor layer is located lower than a top surface of the second insulating layer.

10. The semiconductor device according to claim 9, wherein the second insulating layer has a passivation property.

11. The semiconductor device according to claim 9, wherein the second insulating layer includes any one of aluminum oxide, aluminum oxynitride, aluminum nitride, silicon nitride, gallium oxide, and gallium nitride.

12. The semiconductor device according to claim 9, wherein the semiconductor is an oxide semiconductor.

13. The semiconductor device according to claim 9, wherein the semiconductor is an In—Ga—Zn-based oxide.

14. The semiconductor device according to claim 9, wherein a whole side surface of the semiconductor layer is in contact with the second insulating layer.

15. The semiconductor device according to claim 9, wherein the second insulating layer extends along an edge of the semiconductor layer.

16. The semiconductor device according to claim 9, wherein the trench of the first insulating layer surrounds the semiconductor layer.

* * * * *